(12) United States Patent
Arimoto et al.

(10) Patent No.: US 6,232,793 B1
(45) Date of Patent: May 15, 2001

(54) SWITCHED BACKGATE BIAS FOR FET

(75) Inventors: Kazutami Arimoto; Masaki Tsukude, both of Itami (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/195,460

(22) Filed: Nov. 18, 1998

Related U.S. Application Data

(63) Continuation of application No. 08/957,426, filed on Oct. 24, 1997, now Pat. No. 5,854,561, which is a continuation of application No. 08/708,429, filed on Sep. 5, 1996, now Pat. No. 5,703,522, which is a division of application No. 08/350,064, filed on Nov. 29, 1994, now Pat. No. 5,610,533.

(30) Foreign Application Priority Data

Nov. 29, 1993 (JP) .................................................. 5-298084
Apr. 27, 1994 (JP) .................................................. 6-090303

(51) Int. Cl.[7] .......................... H03K 19/185; H03K 19/96
(52) U.S. Cl. ................................. 326/34; 326/83; 326/98; 327/534
(58) Field of Search .................................. 327/534, 537, 327/108; 326/33, 34, 87, 98, 83, 121, 17

(56) References Cited

U.S. PATENT DOCUMENTS

| | | | |
|---|---|---|---|
| 3,737,673 | * 6/1973 | Suzuki | 326/98 |
| 5,045,717 | 9/1991 | Moen, Jr. et al. . | |
| 5,148,393 | 9/1992 | Furuyama . | |
| 5,179,535 | 1/1993 | Nakayama . | |
| 5,280,455 | 1/1994 | Kanaishi . | |
| 5,319,604 | 6/1994 | Imondi et al. . | |
| 5,448,198 | 9/1995 | Toyoshima et al. . | |
| 5,461,338 | 10/1995 | Hirayama et al. . | |
| 5,486,774 | * 1/1996 | Douseki et al. | 326/33 |
| 5,583,457 | * 12/1996 | Horiguchi et al. | 326/121 |
| 5,614,847 | * 3/1997 | Kawahara et al. | 326/98 |
| 5,880,604 | * 3/1999 | Kawahara et al. | 326/98 |

FOREIGN PATENT DOCUMENTS

| | | |
|---|---|---|
| 5-108194 | 4/1993 | (JP) . |
| 5-210976 | 8/1993 | (JP) . |
| 6-89574 | 3/1994 | (JP) . |

OTHER PUBLICATIONS

"MT–CMOS: 1V High–Speed CMOS Digital Circuit Technology", by Shin'ichiro Mutoh et al., The Institute of Electronics, Information and Communication Engineers Spring Convention, 1994, C–627, 5–195.

"1V High–Speed Digital Circuit Technology with 0.5μm Multi–Threshold CMOS", by Shin'ichiro Mutoh et al., Pro. IEEE ASIC Conference, 1993, pp. 186–189.

"Subthreshold–Current Reduction Circuits for Multi–Gigabit DRAMs", by Takeshi Sakata et al., Symposium on VLSI Circuit Digest of Technical Papers, pp. 45–56.

\* cited by examiner

*Primary Examiner*—Jon Santamauro
(74) *Attorney, Agent, or Firm*—McDermott, Will & Emery

(57) ABSTRACT

A semiconductor circuit or a MOS-DRAM wherein converting means is provided that converts substrate potential or body bias potential between two values for MOS-FETs in a logic circuit, memory cells, and operating circuit of the MOS-DRAM, thereby raising the threshold voltage of the MOS-FETs when in the standby state and lowering it when in active state. The converting means includes a level shift circuit and a switch circuit. The substrate potential or body bias potential is controlled only of the MOS-FETs which are nonconducting in the standby state; this configuration achieves a reduction in power consumption associated with the potential switching. Furthermore, in a structure where MOS-FETs of the same conductivity type are formed adjacent to each other, MOS-FETs of SOI structure are preferable for better results.

8 Claims, 27 Drawing Sheets

SWITCHED BACKGATE BIAS FOR FET

This application is a continuation of application Ser. No. 08/957,426 filed Oct. 24, 1997, now U.S. Pat. No. 5,854,561 which is a continuation of application Ser. No. 08/708,429 filed Sep. 5, 1996, now U.S. Pat. No. 5,703,522, which is a division of application Ser. No. 08/350,064 filed Nov. 29, 1994, now U.S. Pat. No. 5,610,533.

BACKGROUND OF THE INVENTION

1. Field of the Invention

The present invention relates to improvements in semiconductor circuits and MOS-DRAMs, which use fabricated from MOS-FETs.

2. Description of Related Art

FIG. 1 is a circuit diagram showing a complementary MOS inverter used in a conventional semiconductor circuit. Power source potential $V_{CC}$ is applied to the source and backgate (substrate) of a pMOS-FET Q1, and ground potential VsS is applied to the source and backgate of an nMOS-FET Q2. The gates of the FETs Q1 and Q2 are connected to form an input node IN, and their drains are connected to form an output node OUT.

The operation of the thus configured complementary MOS inverter will be described below.

When a logic signal of high level (power source potential $V_{CC}$) is inputted to the input node IN, the FET Q1 is turned off and the FET Q2 is turned on, so that a logic signal of low level (ground potential $V_{SS}=0$ V) is outputted from the output node OUT through the FET Q2.

Conversely, when a logic signal of low level (ground Potential $V_{SS}=0$ V) is inputted from the input node IN, the FET Q1 is turned on and the FET Q2 is turned off, so that a logic signal of high level (power source potential $V_{CC}$) is outputted from the output node OUT through the FET Q1.

With increasing miniaturization of semiconductor circuits and scaling-down of individual MOS-FETs used in semiconductor circuits, MOS-FET performance has been increasing. More specifically, by making the channel length shorter and by reducing the gate oxide thickness and thereby reducing the magnitude of the threshold voltage, higher switching speeds are achieved.

When the threshold voltage is reduced or the channel length is made shorter for MOS-FETs to achieve higher switching speeds, there arises the problem that the drain and source depletion layers can easily be connected together, causing a punch-through situation where current flows between source and drain even when the channel is not formed. This increases the subthreshold current that flows under weak inversion when the gate voltage is near and below the threshold voltage.

FIG. 2 is a cross-sectional view schematically showing a conventional memory cell structure for a MOS-DRAM. An nMOS-FET 53 and a capacitor 50 are formed on a p-well 52. The gate 54 of the FET 53 is connected to a word line WL, the drain 56 is connected to a bit line BL, and the source 55 is connected to one electrode of the capacitor 50 whose other electrode is connected to a cell plate 51.

In the memory cell 57 of this structure, when an high level signal is given through the word line WL to the gate 54, the FET 53 conducts and the capacitor 50 is charged/discharged through the source 55, drain 56, and bit line BL, to perform a write or refresh operation/read operation.

In the memory cell 57, however, the charge stored on the capacitor 50 continuously leaks away. This leakage is caused because of subthreshold leakage through the channel of the FET 53 shown by an arrow 58 or junction leakage at the p-n junction shown by an arrow 59. When peripheral circuitry and the bit line BL are in the standby state, the junction leakage is the main cause; when peripheral circuitry and the bit line BL are in the active state, the sub-threshold leakage is the main cause.

In the MOS-DRAM, refreshing (rewriting) is performed to refresh the stored contents to compensate for the loss due to the above leakage of the memory cell 57. There are two types of refresh: pause refresh that is performed when the peripheral circuitry and the bit line BL are in the standby state, and disturb refresh that is performed when the peripheral circuitry and the bit line BL are in the active state. As the leakage increases, the refresh cycle must be made shorter to perform refresh with higher frequency.

When the substrate potential (p-well potential) of the FET 53, which is usually a negative potential, is reduced in magnitude to reduce the junction leakage, the magnitude of the threshold voltage for the FET 53 decreases and the junction leakage is reduced. This, however, causes the problem that the subthreshold leakage increases.

In "MT(Multi-Threshold)-CMOS: 1V High-Speed CMOS Digital Circuit Technology, 1994, The Institute of Electronics, Information and Communication Engineers Spring Convention, C-627,5-195" and "1V High-Speed Digital Circuit Technology with 0.5 μm Multi-Threshold (MT) CMOS, (Proc. IEEE ASIC Conf., 1993, pp. 186–189)", there is disclosed a CMOS circuit constructed with pMOS and nMOS FETs having two kinds of threshold voltage, a high threshold voltage and a low threshold voltage. The CMOS circuit using the MT-MOS technology is intended to reduce the subthreshold current that flows during standby state and to increase operating speeds in active state. The circuit construction is as follows. The logic circuit is constructed with low-threshold voltage (0.3 to 0.4 V) FETs. The power supply line and secondary power supply line are connected via a high-threshold voltage (0.7 V) FET that is used to shut off the leak path. Further, the ground line and secondary ground line are connected via another high-threshold voltage (0.7 V) FET. The logic circuit is connected between the secondary power supply line and the secondary ground line.

FIG. 3 is a circuit diagram showing a CMOS circuit using the MT-MOS technology in which the logic circuit is composed of an inverter array. The gates of a pMOS-FET Q51 and nMOS-FET Q52 in an inverter $I_5$ are connected to form an input node IN, while the node between the drains of the pMOS-FET Q51 and nMOS-FET Q52 is connected to the node between the gates of a pMOS-FET Q53 and nMOS-FET Q54 in an inverter $I_6$. Likewise, the node between the drains of the pMOS-FET Q53 and nMOS-FET Q54 is connected to the node between the gates of a pMOS-FET Q55 and nMOS-FET Q56 in an inverter $I_7$, while the node between the drains of the pMOS-FET Q55 and nMOS-FET Q56 is connected to the node between the gates of a pMOS-FET Q57 and nMOS-FET Q58 in an inverter $I_8$. The drains of the PMOS-FET Q57 and nMOS-FET Q58 are connected to form an output node OUT.

The sources of the pMOS-FETs Q51, Q53, Q55, and Q57 are connected to a secondary power supply line $V_{CC1}$, while the sources of the nMOS-FETs Q52, Q54, Q56, and Q58 are connected to a secondary ground line $V_{SS1}$. The secondary power supply line $V_{CC1}$ is connected to a power supply line $V_{CC}$ (power source potential: $V_{CC}$) via a pMOS-FET Q59 whose gate is supplied with an inverted clock signal #ø. The secondary ground line $V_{SS1}$ is connected to a ground line $V_{SS}$ (ground potential: $V_{SS}$) via an nMOS-FET Q60 whose gate is supplied with a clock signal ø. The threshold voltage of the FETs Q59 and Q60 is larger than that of the FETs Q51, Q52, Q53, Q54, Q55, Q56, Q57, and Q58 that form the inverters $I_5$, $I_6$, $I_7$, and $I_8$.

For the inverter array using the MT-MOS-FETs, the FETs Q59 and Q60 are caused to conduct in active state. As a result, the power source potential $V_{CC}$ is given to the sources of the pMOS-FETs Q51, Q53, Q55, and Q57 via the secondary power supply line $V_{CC1}$, while the sources of the nMOS-FET Q52, Q54, Q56, and Q58 are supplied with the ground potential $V_{SS}$ via the secondary ground line $V_{SS1}$.

In standby state, on the other hand, the FETs Q59 and Q60 are nonconducting. This disconnects the secondary power supply line $V_{CC1}$ from the power source potential $V_{CC}$ and the secondary ground line $V_{SS1}$ from the ground potential $V_{SS}$. As a result, the current path between the power supply and ground is cut off, and therefore, the subthreshold current is reduced. The low threshold voltage of the FETs Q51, Q52, Q53, Q54, Q55, Q56, Q57, and Q58 that form the inverters $I_5$, $I_6$, $I_7$, and $I_8$ allows high-speed operations during active state. However, since the subthreshold current flows through the inverter array during standby state, the potential on the secondary power supply line $V_{CC1}$ may drop or the potential on the sub ground line $V_{SS1}$, may rise. When this happens, when switching from standby to active state, a significant delay may occur in the switching because of such changes in the potential of the secondary power supply line $V_{CC1}$ or of the secondary ground line $V_{SS1}$, and in the worst case, the logic may change. Such a phenomenon is pronounced when the active period is long.

FIG. 4 is a circuit diagram showing a word driver configuration. Each word driver WD consists of a pMOS-FET Q61 and an nMOS-FET Q62 connected in series between the ground and the power supply line $V_{PP}$ connected to a voltage-raising power supply; a decoder signal X is inputted to the gates of the pMOS-FET Q61 and nMOS-FET Q62, and a word line WL is connected to the node between the drains of the pMOS-FET Q61 and nMOS-FET Q62. Word drivers WD of such configuration are arranged in a matrix array, n word drivers in each column and m word drivers in each row ($WD_{11}$ to $WD_{mn}$).

When the decoder signal $X_{11}$ is inputted to the selected word driver (for example, the word driver $WD_{11}$), the associated word line WL is activated.

In this configuration, however, subthreshold current flows into the word drivers in the standby state; this becomes a problem in realizing low-power dissipation circuit design.

As the countermeasure, Japanese Patent Application Laid-Open No. 5-210976 (1993) discloses a word driver which incorporates a converting means (FET) for switching the power source potential on and off to the PMOS-FET Q61 in the word driver WD, thereby preventing the subthreshold current from flowing.

Furthermore, "Subthreshold-Current Reduction Circuits for Multi-Gigabit DRAM's, Symposium on VLSI Circuit Dig. of Tech. Papers, pp. 45–46" discloses a hierarchical-structured word driver configuration that is provided, between the word driver and the above-mentioned converting means, with another converting means (FETs) for switching supply of the power source potential to the pMOS-FET Q61 in the word driver WD on a column-by-column basis. FIG. 5 is a circuit diagram showing this word driver configuration. The power supply line $V_{PP}$ is connected via a pMOS-FET Q70 to pMOS-FETs Q71, Q72, ..., Q7m which are connected to word driver columns B1, B2, ..., Bm, respectively. To the gates of the FETs Q71, Q72, ..., Q7m are supplied with column select signals K1, K2, ..., Km each of which is set to "L" only when the corresponding word driver column, B1, B2, ..., Bm, contains the word driver WD to be selected.

In the above configuration, when switching to the active state from the standby state in which the source voltage of the pMOS-FET Q61 is at a slightly dropped level, there is no need to raise the source voltage for the pMOS-FETs Q61 in all the word drivers WD, and it is only necessary to raise the source voltage for the word driver column containing the selected word driver. This reduces the current consumption associated with the switching.

The word driver configuration shown in FIG. 5, however, has the problem that the rising of the selected word line delays since the source voltage of the pMOS-FET Q61 need to be raised from a slightly dropped level to the power source potential when switching from the standby state to the active state.

SUMMARY OF THE INVENTION

The present invention has been devised to resolve the above mentioned problems, and it is a primary object of the invention to provide a semiconductor circuit or a MOS-DRAM that achieves a high-speed switching characteristic and low subthreshold current characteristic at the same time.

According to the present invention, the semiconductor circuit comprises MOS-FETs to which a first potential or a second potential is to be supplied as substrate potential or body bias potential, voltage supply means for supplying the first and second potentials, and converting means for converting the substrate potential or body bias potential to the first potential or second potential. The converting means includes a level shift circuit for outputting a signal for conversion to the first potential or second potential, and a switch circuit for switching between the first potential and second potential to the MOS-FET according to the output signal from the level shift circuit. The converting means operates in accordance with a signal based on the operation state of the MOS-FET or with a control clock signal supplied from a clock signal generating means.

By setting the first potential and second potential at respectively appropriate values, the magnitude of the threshold voltage of the MOS-FETs is reduced in the active state and increased in the standby state. This improves their switching characteristics as well as subthreshold current characteristics.

When MOS-FETs of SOI structure are used, the body bias potential is converted, not the substrate potential; accordingly, power consumption is reduced, compared to the configuration that uses MOS-FETs of bulk structure where wells are formed. Furthermore, since there is no need to form wells, higher integration can be achieved.

More specifically, the semiconductor circuit is constituted as follows: the MOS-FETs of SOI structure are isolated from each other by an isolating oxide film; by an FS isolation layer formed by channeling off a portion of a channel layer, the FS isolation layer being connected to the converting means; by an isolating oxide film and also by an FS isolation layer formed by channeling off a portion of a channel layer, the FS isolation layer being connected to the converting means; or by an FS isolation layer formed by channeling off a portion of a channel layer, wherein the FS isolation layer on each side of one MOS-FET of one conductivity type is connected to the converting means, the FS isolation layer on each side of the other MOS-FET of the same conductivity type is connected to a prescribed potential, and an isolation layer formed between each FS isolation layer is supplied with another prescribed potential.

The MOS-FETs may form a logic circuit. The MOS-FETs may also be used to form an operating circuit of a MOS-DRAM or to form memory cells of a MOS-DRAM.

In the case of an inverter array as an example of the logic circuit, when the converting means for converting the substrate potential or body bias potential is connected only to the MOS-FETs that are nonconducting in the standby state, power consumption associated with the potential converting can be reduced by half. Preferably, the inverter array may be connected between a secondary power supply line and secondary ground line which are supplied with voltage and ground potential, respectively, only in the active state.

When a word driver is taken as an example of the MOS-DRAM operating circuit, the present invention can be applied to any word driver already used in practice, a word driver in which power source potential is applied only when in the active state, or a word driver configuration of hierarchical structure in which the operation is controlled on a column-by-column basis. In any of these word driver, the present invention achieves a reduction in standby subthreshold current and an increase in operating speed.

Further, when the MOS-FETs are used to form memory cells, the magnitude of the threshold voltage of the MOS-FETs is reduced during pause refresh of the memory cells, thus reducing junction leakage, while during disturb refresh of the memory cells, the magnitude of the threshold voltage of the MOS-FETs is increased, thereby reducing subthreshold leakage.

The above and further objects and features of the invention will more fully be apparent from the following detailed description with accompanying drawings.

DESCRIPTION OF THE PREFERRED EMBODIMENTS

The preferred embodiments of the present invention will be described in detail below with reference to the accompanying drawings.

EMBODIMENT 1

Figure 6:
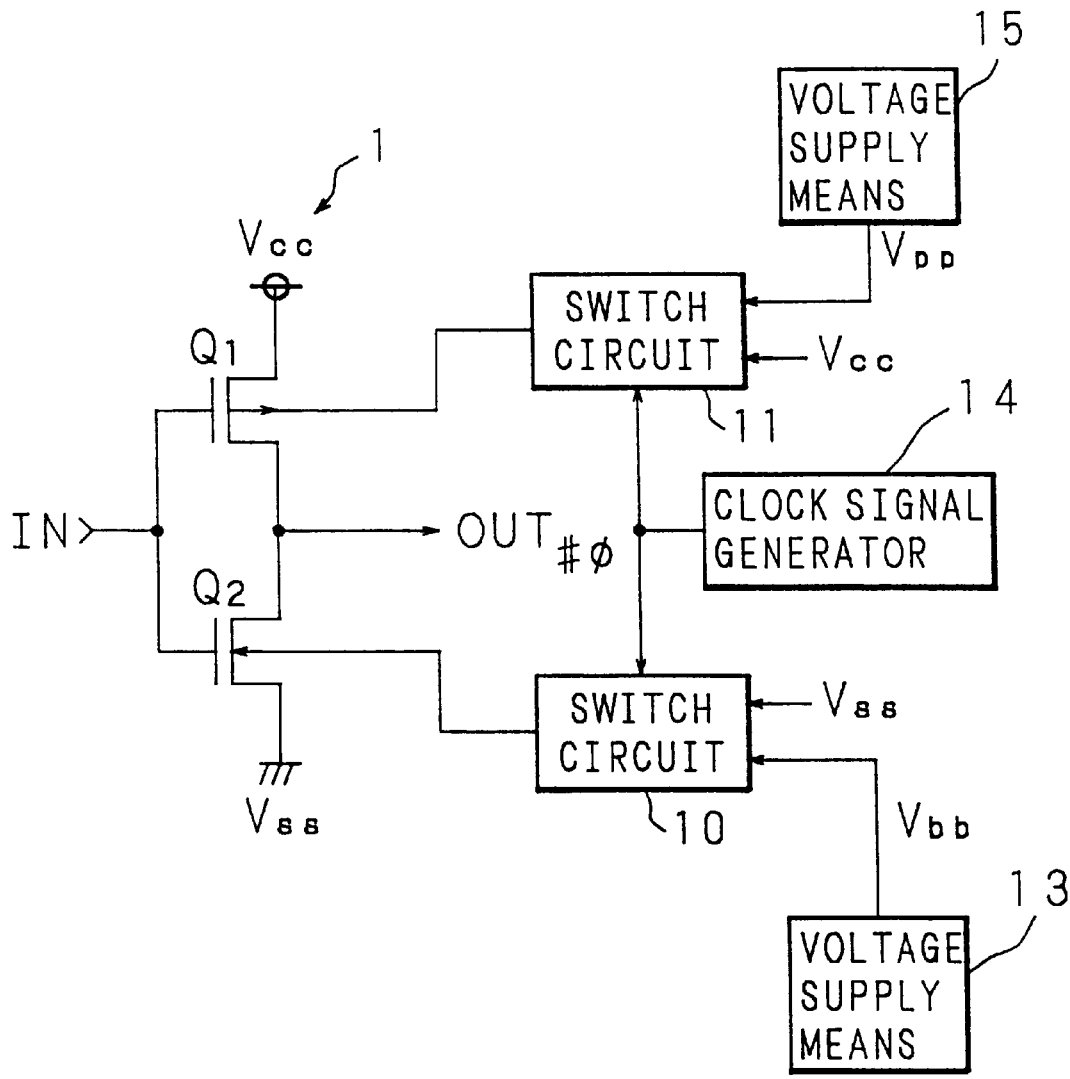
FIG. 6 is a circuit diagram of a complementary MOS inverter, showing an example of a logic circuit constituting a first embodiment of the semiconductor circuit according to the present invention.

FIG. 6 is a circuit diagram of a complementary MOS inverter, showing a logic circuit constituting a first embodiment of the semiconductor circuit according to the present invention. Power source potential $V_{CC}$ is applied to the source of an FET Q1, and ground potential $V_{SS}$ is applied to the source of an FET Q2. The gates of the FET Q1 and FET Q2 are connected to form an input node IN, and their drains are connected to form an output node OUT. The backgate of the FET Q2 is connected to a switch circuit 10 which switches the ground potential $V_{SS}$ (=0 V) and potential $V_{bb}$ (<0 V) lower than the ground potential $V_{SS}$, and the backgate of the FET Q1 is connected to a switch circuit 11 which switches the power source potential $V_{cc}$ and potential $V_{PP}$ higher than the power source potential $V_{cc}$.

Here, the FET Q1 and FET Q2 are designed so that, when the potential $V_{PP}$ higher than the power source potential $V_{CC}$ and the potential $V_{bb}$ lower than the ground potential $V_{SS}$ are applied to the respective backgates, subthreshold current of approximately the same magnitude as in the conventional circuit, for example, is conducted. Then, when the power source potential $V_{CC}$ and the ground potential $V_{SS}$ are applied to the respective backgates, the magnitude of the threshold potential is smaller than that of the conventional, so that the switching speed can be increased as compared to the conventional though the subthreshold current increases. When the threshold potential is reduced in magnitude in this manner when the complementary MOS inverter 1 operates, subthreshold current increases in proportion to the time during which the complementary MOS inverter 1 operates, but the switching speed can be increased as compared with the conventional circuit, with a slight increase in current unless the proportion of the operating time is large.

Figure 7:
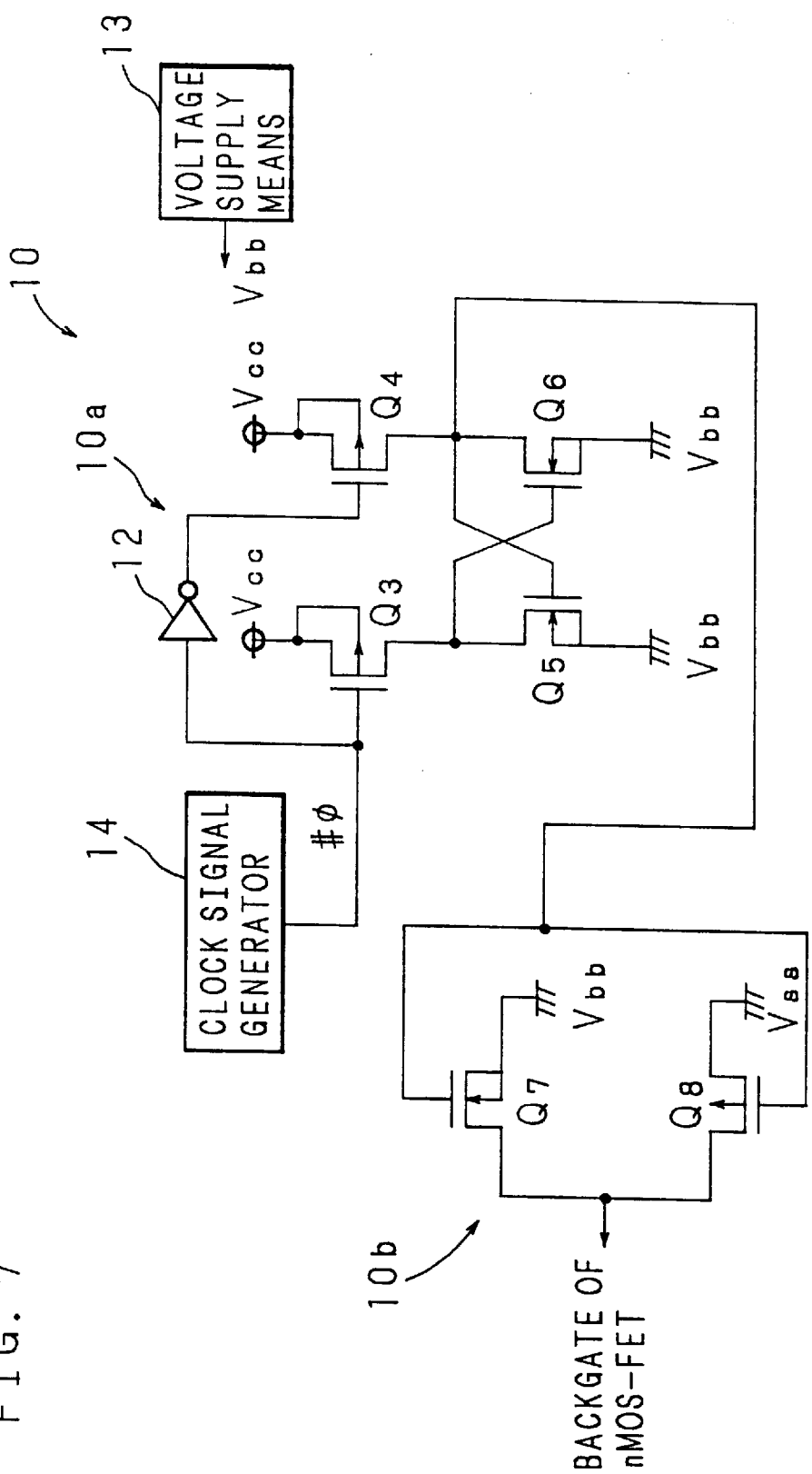
FIG. 7 is a circuit diagram showing an example of a switch circuit shown in FIG. 6.

FIG. 7 is a circuit diagram showing an example of the switch circuit 10 shown in FIG. 6 for switching the ground potential $V_{SS}$ and the potential $V_{bb}$. pMOS-FETs Q3 and Q4, nMOS-FETs Q5 and Q6, and an inverter 12 form a shift level circuit 10a, in which the drains of the FETs Q3 and Q5 are connected and the drains of the FETs Q4 and Q6 are connected, while the FETs Q5 and Q6 are cross-coupled with the gate of one FET connected to the drain of the other and vice versa. The input node of the level shift circuit 10a is provided on the gate of the FET Q3, and is connected to the gate of the FET Q4 via the inverter 12. A clock signal generator 14 outputs a signal #ø which is applied to the input node. The sources and backgates of the FETs Q3 and Q4 are connected to the power source potential $V_{CC}$, while the sources and backgates of the FETs Q5 and Q6 are connected to the potential $V_{bb}$ supplied from a voltage supply means 13 and lower than the ground potential $V_{SS}$.

The output node of the level shift circuit 10a is provided at the node between the drains of the FET Q4 and FET Q6 forms. This output node is connected to the input node of a selector switch 10b.

The selector switch 10b consists of an nMOS-FET Q7 and a pMOS-FET Q8; the gates of the FET Q7 and FET Q8 are connected to form the input node of the selector switch 10b, and their drains are connected to form the output node. The source and backgate of the FET Q7 are connected to the potential $V_{bb}$ supplied from the voltage supply means 13 and lower than the ground potential $V_{SS}$, while the source of the FET Q8 is connected to the ground potential $V_{SS}$.

Figure 8:
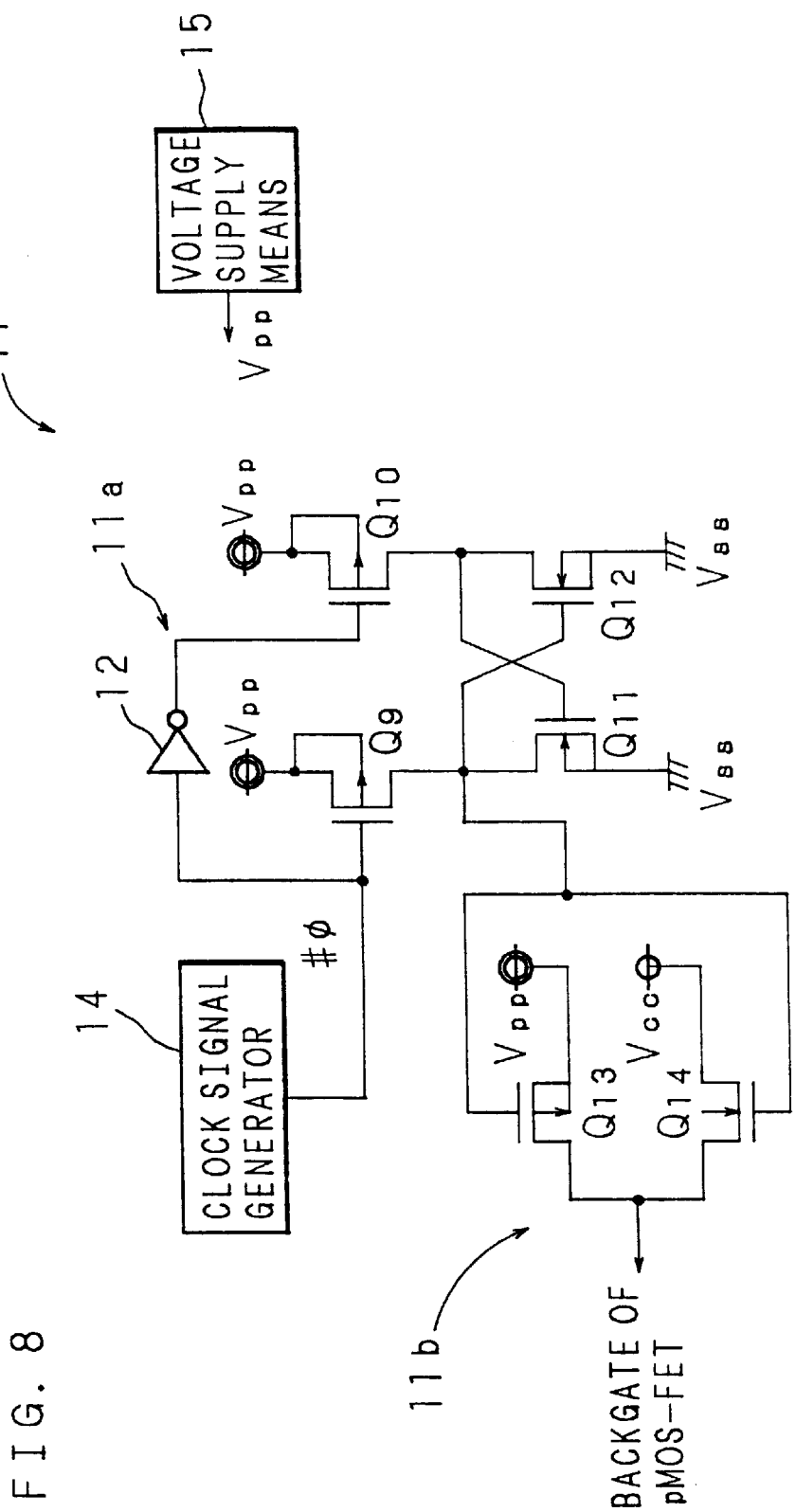
FIG. 8 is a circuit diagram showing an example of a switch circuit shown in FIG. 6.

FIG. 8 is a circuit diagram showing an example of the switch circuit 11 shown in FIG. 6 for switching the power source potential $V_{CC}$ and the potential $V_{PP}$. pMOS-FETs Q9 and Q10, nMOS-FETs Q11 and Q12, and an inverter 12 form a shift level circuit 11a, in which the drains of the FETs Q9 and Q11 are connected and the drains of the FETs Q10 and Q12 are connected, while the FETs Q11 and Q12 are cross-coupled with the gate of one FET connected to the drain of the other and vice versa. The input node of the level shift circuit 11a is provided at the gate of the FET Q9, and is connected to the gate of the FET Q10 via the inverter 12. The clock signal generator 14 outputs a signal #ø which is applied to the input node. The sources and backgates of the FETs Q9 and Q10 are connected to the potential $V_{PP}$ supplied from a voltage supply means 15 and higher than the power source potential $V_{CC}$; on the other hand, the sources of the FETs Q11 and Q12 are connected to the ground potential $V_{SS}$.

The output node of the level shift circuit 11a is provided at the node between the drains of the FET Q9 and FET Q11 forms. This output node is connected to the input node of a selector switch 11b.

The selector switch 11b consists of a PMOS-FET Q13 and an nMOS-FET Q14; the gates of the FET Q1 and FET Q14 are connected to form the input node of the selector switch 11b, and their drains are connected to form the output node. The source and backgate of the FET Q13 are connected to the potential $V_{PP}$ supplied from the voltage supply means 15 and higher than the power source potential $V_{CC}$, while the source of the FET Q14 is connected to the power source potential $V_{CC}$.

Figure 9:
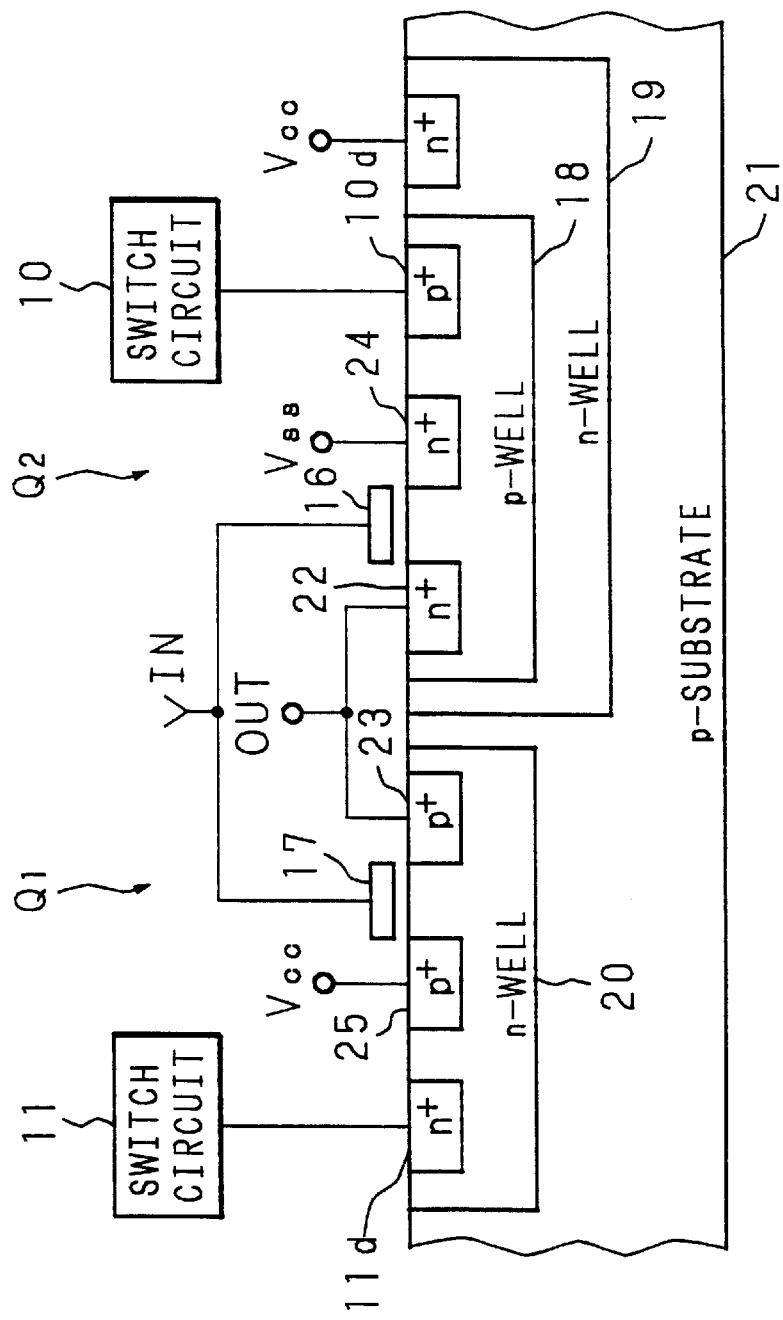
FIG. 9 is a cross-sectional view showing a well structure of the complementary MOS inverter shown in FIG. 6.

FIG. 9 is a cross-sectional view showing the well structure for the complementary MOS inverter 1 shown in FIG. 6. An n-well 19 for the power supply line and an n-well 20 for the FET Q1 are formed in the upper part of a p-substrate 21, and further a p-well 18 for the FET Q2 is formed in the upper part of the n-well 19, thus forming a triple-well structure. Furthermore, impurity diffusion layers 11d, 25, and 23 for the backgate, source, and drain electrodes, respectively, are formed in the upper part of the n-well 20; similarly, in the upper part of the p-well 18 are formed impurity diffusion layers 10d, 24, and 22 for the backgate, source, and drain electrodes, respectively. Gates 17 and 16 are formed on the n-well 20 and p-well 18, respectively, with an insulating layer interposed between each gate and its associated well. The switch circuits 10 and 11 are each formed in a well where the potential is fixed.

The operation of the thus structured complementary MOS inverter 1 will be described below.

When the complementary MOS inverter 1 is not in operation, an inverted control clock signal #ø of high level is inputted to the switch circuits 10 and 11 from the clock signal generator 14, and the potential $V_{bb}$ (<0) lower than the ground potential $V_{SS}$ and the potential $V_{PP}$ higher than the power source potential $V_{CC}$ are outputted from the switch circuits 10 and 11, respectively, and are applied to the backgates of the FET Q2 and FET Q1, respectively. At this time, the magnitude of the threshold voltage of the FET Q2 and FET Q1 is larger than that when the ground potential $V_{SS}$ and power source potential $V_{CC}$ are applied to the backgates of the respective FETs, and the subthreshold current is reduced.

On the other hand, when the complementary MOS inverter 1 is in operation, the inverted control clock signal #ø of low level is inputted to the switch circuits 10 and 11 from the clock signal generator 14, and the ground potential $V_{SS}$ and the power source potential $V_{CC}$ are outputted from the switch circuits 10 and 11, respectively, and are applied to the backgates of the FET Q2 and FET Q1, respectively. At this time, the magnitude of the threshold potential of the FET Q2 and FET Q1 is smaller than that when the potential $V_{bb}$ lower than the ground potential $V_{SS}$ and the potential $V_{PP}$ higher than the power source potential $V_{CC}$ are applied to the backgates of the respective FETs, and though the sub-threshold current increases, higher switching speeds are achieved.

When a logic signal of high level (power source potential $V_{CC}$) is inputted to the input node IN, the FET Q1 is turned off and the FET Q2 is turned on, so that a logic signal of low level (ground potential $V_{SS}$=0 V) is outputted from the output node OUT through the FET Q2.

Conversely, when a logic signal of low level (ground potential $V_{SS}$=0 V) is inputted to the input node IN, the FET Q1 is turned on and the FET Q2 is turned off, so that a logic signal of high level (power source potential $V_{CC}$) is outputted from the output node OUT through the FET Q1.

The operation of the switch circuit 10 shown in FIG. 7 will be described below.

When the complementary MOS inverter 1 is not in operation, the inverted control clock signal #ø of high level is inputted from the clock signal generator 14, as described above. As a result, the FET Q4 is ON and the FET Q5 is also ON, so that the power source potential $V_{CC}$ is outputted from the level shift circuit 10a through the FET Q4. At this time, the FET Q3 and FET Q6 are OFF, and no short-circuit occurs at the FET Q5 and FET Q4.

In the selector switch 10b, when the power source potential $V_{CC}$ is inputted from the level shift circuit 10a, the FET Q7 is ON and the FET Q8 is OFF, so that the potential $V_{bb}$ lower than the ground potential $V_{SS}$ is outputted through the FET Q7.

On the other hand, when the complementary MOS inverter 1 is in operation, the inverted control clock signal #ø of low level is inputted from the clock signal generator 14, as described above. As a result, the FET Q3 is ON and the FET Q6 is also ON, so that the potential $V_{bb}$ lower than the ground potential $V_{SS}$ is outputted from the level shift circuit 10a through the FET Q6. At this time, the FET Q4 and FET Q5 are OFF, and no short-circuit occurs at the FET Q6 and FET Q3.

In the selector switch 10b, when the potential $V_{bb}$ is inputted from the level shift circuit 10a, the FET Q8 is ON and the FET Q7 is OFF, as a result of which to the output node is supplied the ground potential $V_{SS}$ through the FET Q8.

Next, the operation of the switch circuit 11 shown in FIG. 8 will be described below.

When the complementary MOS inverter 1 is not in operation, the inverted control clock signal #ø of high level is inputted from the clock signal generator 14, as described above. As a result, the FET Q10 is ON and the FET Q11 is also ON, and the output node of the level shift circuit 11a is set to the ground potential $V_{SS}$ through the FET Q11. At this time, the FET Q9 and FET Q12 are OFF, and no short-circuit occurs at the FET Q11 and FET Q10.

In the selector switch 11b, when the ground potential $V_{SS}$ is inputted from the level shift circuit 11a, the FET Q13 is ON and the FET Q14 is OFF, so that the potential $V_{pp}$ higher than the power source potential $V_{cc}$ is outputted through the FET Q13.

On the other hand, when the complementary MOS inverter 1 is in operation, the inverted control clock signal #ø of low level is inputted from the clock signal generator 14, as described above. As a result, the FET Q9 is ON and the FET Q12 is also ON, so that the potential $V_{PP}$ higher than the power source potential $V_{cc}$ is outputted from the level shift circuit 11a through the FET Q9. At this time, the FET Q10 and FET Q11 are OFF, and no short-circuit occurs at the FET Q12 and FET Q9.

In the selector switch 11b, when the potential $V_{pp}$ is inputted from the level shift circuit 11a, the FET Q13 is OFF and the FET Q14 is ON, so that the power source potential $V_{CC}$ is outputted through the FET Q14.

The above description has dealt with an example of the structure in which the backgate bias is switchable for both the pMOS and nMOS FETs, but the structure is not limited to the illustrated one; for example, a structure in which the backgate bias is switchable only for either the pMOS-FET or nMOS-FET may be employed. In that case, the structure in which the backgate bias is switchable only for the pMOS-FET can be realized by using a twin-well structure in a p-substrate, and the structure in which the backgate bias is switchable only for the nMOS-FET can be realized by using a twin-well structure in an n-substrate; there is no need to employ a triple-well structure such as shown in FIG. 9.

Further, the voltage supply means 13 and 15 need not be internal to the semiconductor circuit; these may be replaced by terminals via which externally generated potentials are inputted into the semiconductor circuit.

EMBODIMENT 2

Figure 10:
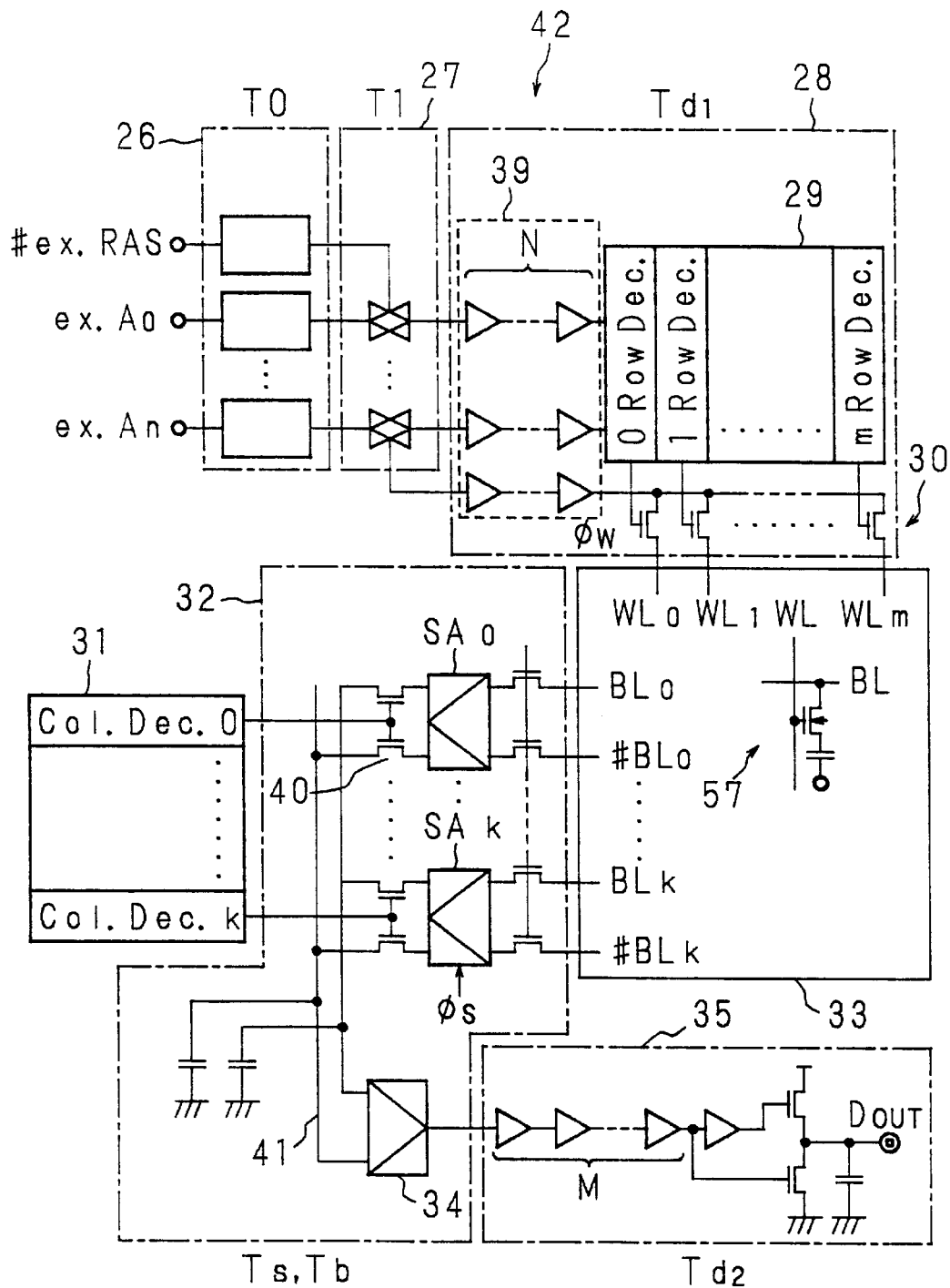
FIG. 10 is a block diagram showing a configuration of a MOS-DRAM.
Figure 11:
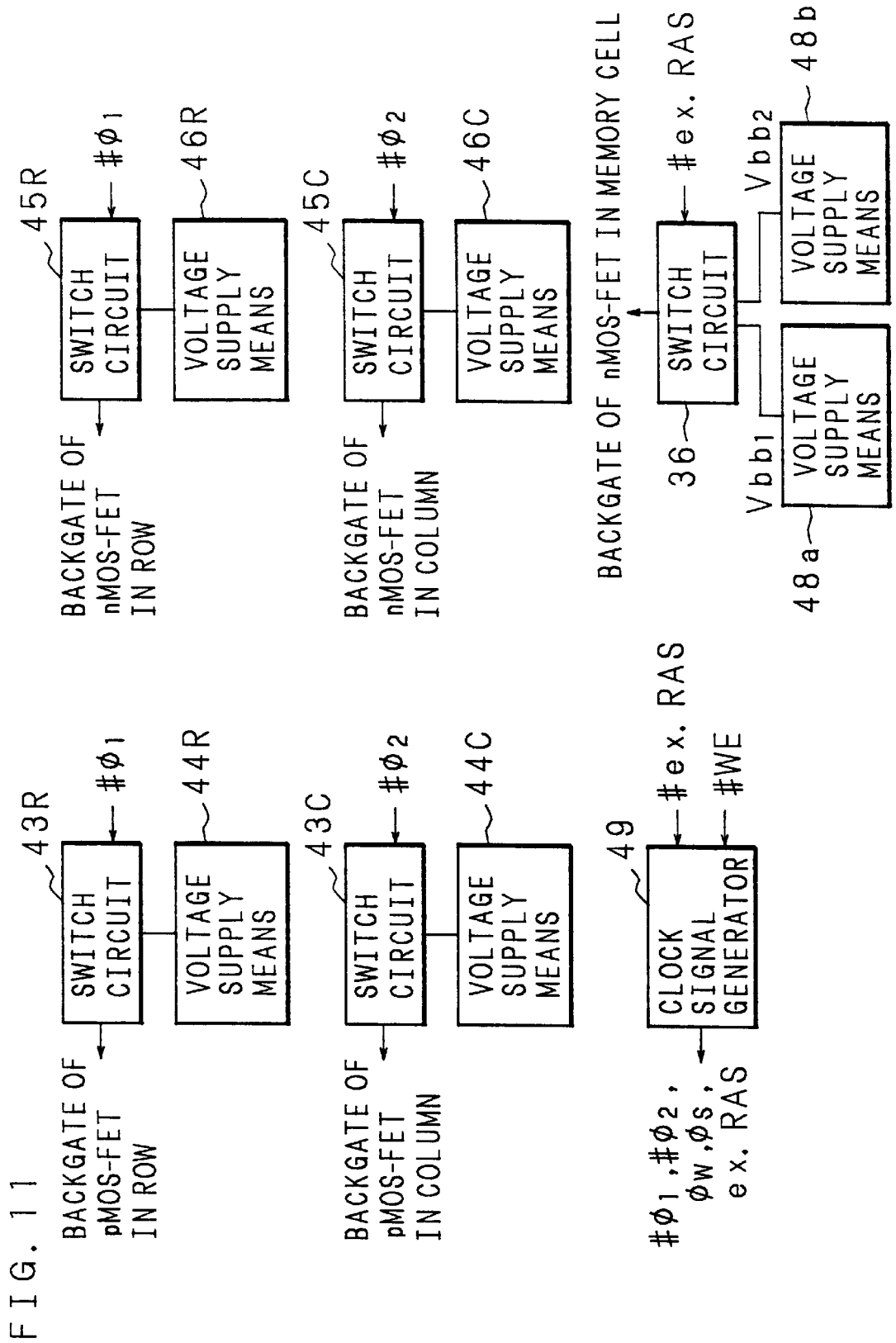
FIG. 11 is a block diagram showing a configuration of a second embodiment according to the present invention.

FIGS. 10 and 11 are block diagrams showing the configuration of a MOS-DRAM according to a second embodiment of the present invention. An external row address signal is inputted via input terminals ex. $A_0$–ex. $A_n$ into an input buffer 26, latched into a latch circuit 27, and then fed into a row decoder 29 through a buffer gate array 39. The row decoder 29 selects an appropriate word line $WL_0$–$WL_m$, and the selected word line $WL_0$–$WL_m$ is driven by a word driver 30 to access the intended memory cell 57 connected to that word line in a memory cell array 33.

The contents of the accessed memory cell 57 are outputted to a bit lines $BL_0$–$BL_k$ and amplified by sense amplifiers $SA_0$–$SA_k$, while at the same time the same contents are rewritten into the memory cell 57.

On the other hand, an external column address signal, inputted via input terminals, an input buffer, a latch circuit, and a buffer gate array, is fed into a column decoder 31, then selects the appropriate sense amplifier among the amplifiers $SA_0$–$SA_k$. The above-described output on the bit line is amplified by the selected amplifier among the amplifiers $SA_0$–$SA_k$, passes through an I/O gate 40 and an I/O bus 41, amplified by a preamplifier 34, and then is outputted from an output buffer 35.

When the logic circuits in the input buffer 26, latch circuit 27, N-stage buffer gate 39, row decoder 29, and word driver 30 that form the row operating circuits of the MOS-DRAM 42, are put into operation, the substrate potential of the pMOS-FETs in these logic circuits is switched from the potential $V_{PP}$, supplied from a voltage supply means 44R, to the power source potential $V_{CC}$ by means of a switch circuit 43R that is supplied with the control clock signal #ø$_1$ hereinafter described. Likewise, the substrate potential of the nMOS-FETs in the logic circuits is switched from the potential $V_{bb}$ supplied from a voltage supply means 46R to the ground potential $V_{SS}$ by means of a switch circuit 45R that is supplied with the control clock signal #ø$_1$.

On the other hand, when the logic circuits in the I/O gate 40, preamplifier 34, column decoder 31, M-stage buffer gate, and output buffer 35 that form the column operating circuits of the MOS-DRAM 42, are put into operation, the substrate potential of the pMOS-FETs in these logic circuits is switched from the potential $V_{PP}$, supplied from a voltage supply means 44C, to the power source potential $V_{CC}$ by means of a switch circuit 43C that is supplied with the control clock signal #ø$_2$ hereinafter described. Likewise, the substrate potential of the nMOS-FETs in the logic circuits is switched from the potential $V_{bb}$, supplied from a voltage supply means 46C, to the power source potential $V_{cc}$ by means of a switch circuit 45C that is supplied with the control clock signal #ø$_2$.

The switch circuits 43R and 43C are similar in configuration to the switch circuit 11 shown in FIG. 8, and the switch circuits 45R and 45C are similar in configuration to the switch circuit 10 shown in FIG. 7.

The above sequence of operations are controlled by the control signals #ø$_1$ and #ø$_2$ that the clock signal generator 49 outputs in response to the inverted enable signal #WE, the inverted external RAS (row address strobe) signal (external row select signal) #ex.RAS, and so on, and by an activation signal ø$_W$ for the word driver 30, activation signal ø$_S$ for the sense amplifier 34, and so on.

Figure 12:
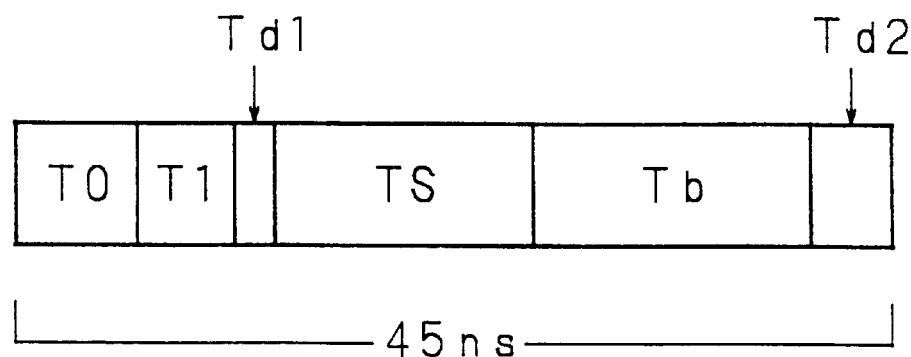
FIG. 12 is a timing chart showing a breakdown of the transfer time of an external RAS signal in the second embodiment.

FIG. 12 is a timing chart showing the breakdown of the transfer time of the external RAS signal through the internal circuits of the MOS-DRAM 42. In the FIG., T0 is the time taken for conversion from TTL circuit potential to MOS circuit potential in the input buffer 26, T1 is the external row address latch time in the latch circuit 27, Td1 is the row decoder setup time in a block 28 that comprises the row decoder 29 and word driver 30, TS and Tb are the memory cell select time and sense time in a block 32 that comprises the sense amplifiers $SA_0$–$SA_k$ and preamplifier 34, and Td2 is the delay time from the preamplifier 34 to the output buffer 35.

The control signal #$\phi_1$ is applied to switch the substrate potential of the MOS-FETs forming the logic circuits in the input buffer 26, latch circuit 27, N-stage buffer gate 39, row decoder 29, and word driver 30 that form the row operating circuits of the MOS-DRAM 42. The control signal #$\phi_2$ is applied to switch the substrate potential of the MOS-FETs forming the logic circuits in the preamplifier 34 an output buffer 35 that form the column operating circuits.

The clock signal generator 49 generates the control clock signal #$\phi_1$, for example, at the falling edge of the inverted external RAS signal #ex.RAS, and at the rising edge of the activation signal $\phi_W$ for the word driver 30, and generates the control signal #$\phi_2$, for example, at the rising edges of the activation signal $\phi_S$ for the sense amplifier 34 and the inverted external RAS signal #ex.RAS.

Figure 13:
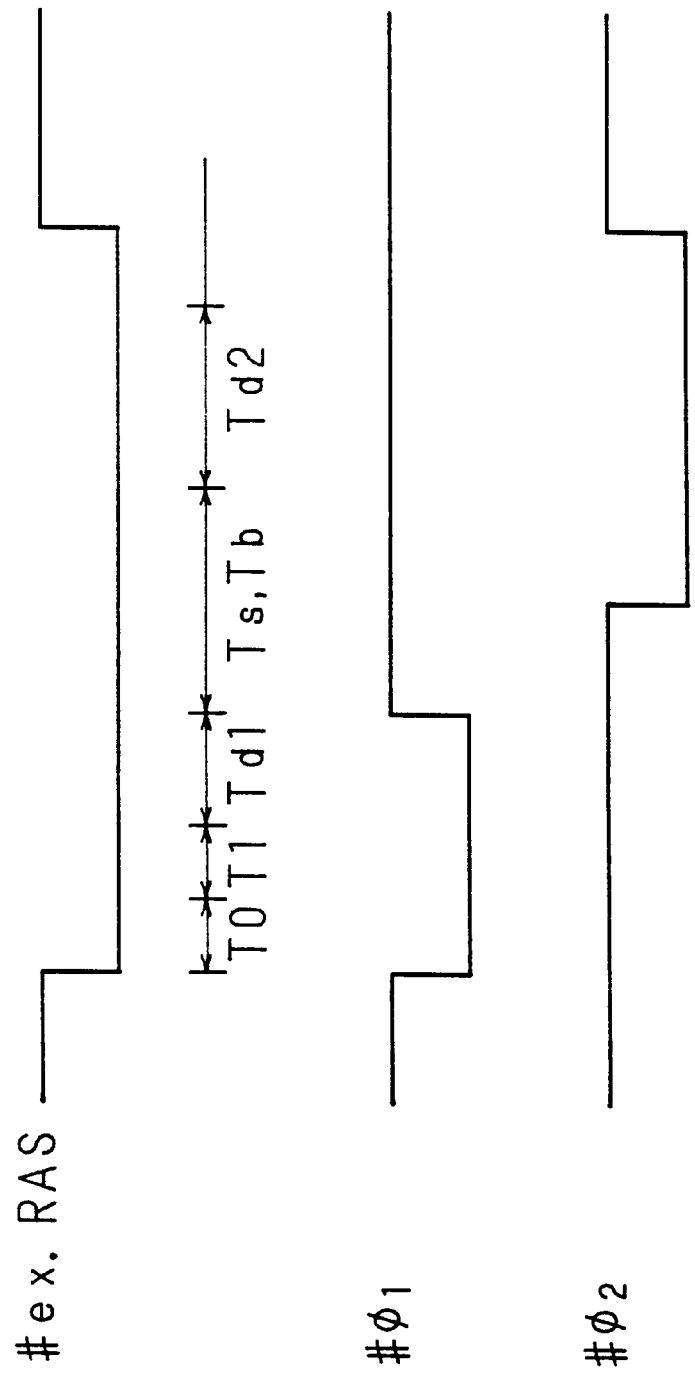
FIG. 13 is a timing chart showing a relationship of the external RAS signal with respect to control clock signals in the MOS-DRAM.

FIG. 13 is a timing chart showing the relationship between the thus generated control clock signals #$\phi_1$, #$\phi_2$ and the inverted external RAS signal #ex.RAS. During the times T0, T1, and Td1 taken in the input buffer 26, latch circuit 27, N-stage buffer gate 39, row decoder 29, and word driver 30 that form the row operating circuits of the MOS-DRAM 42, that is, during the times T0, T1 and Td1 taken for the operation of the input buffer 26, latch circuit 27, N-stage buffer gate 39, row decoder 29, and word driver 30, the control clock signal #$\phi_1$ of low level is inputted to the switch circuits 43R and 45R.

On the other hand, during the times Tb and Td2 taken in the preamplifier 34 and output buffer 35 that form the column operating circuit of the MOS-DRAM 42, that is, during the times Tb and td2 taken for the operation of the preamplifier 34 and output buffer 35, the control clock signal #$\phi_2$ of low level is inputted to the switch circuits 43C and 45C.

Accordingly, when the row operating circuits of the MOS-DRAM 42, i.e. the input buffer 26, latch circuit 27, N-stage buffer gate 39, row decoder 29, and word driver 30, are in operation, the switch circuits 43R and 45R respectively output the power source potential $V_{CC}$ and ground potential $V_{SS}$, which are applied to the backgates of the pMOS-FETs and nMOS-FETs, respectively, in the operating circuits. At this time, the magnitude of the threshold potential of the pMOS-FETs and nMOS-FETs is smaller than that when the potential $V_{PP}$ higher than the power source potential $V_{CC}$ and the potential $V_{bb}$ lower than the ground potential $V_{SS}$ are applied to the backgates of the respective MOS-FETs, and though the subthreshold current increases, higher switching speeds are achieved.

On the other hand, when the input buffer 26, latch circuit 27, N-stage buffer gate 39, row decoder 29, and word driver 30 are not in operation, the switch circuits 43R and 45R respectively output the potential $V_{PP}$ higher than the power source potential $V_{CC}$ and the potential $V_{bb}$ lower than the ground potential $V_{SS}$, which are applied to the backgates of the pMOS-FETs and nMOS-FETs, respectively, in the operating circuits. At this time, the magnitude of the threshold potential of the pMOS-FETs and nMOS-FETs is larger than that when the power source potential $V_{CC}$ and the ground potential $V_{SS}$ are applied to the backgates of the respective MOS-FETs, and the subthreshold current is reduced.

Likewise, when the column operating circuits of the MOS-DRAM 42, i.e. the preamplifier 34 and output buffer 35, are in operation, the switch circuits 43C and 45C respectively output the power source potential $V_{CC}$ and ground potential $V_{SS}$, which are applied to the backgates of the pMOS-FETs and nMOS-FETs, respectively, in the operating circuits. At this time, the magnitude of the threshold potential of the pMOS-FETs and nMOS-FETs is smaller than that when the potential $V_{PP}$ higher than the power source potential $V_{CC}$ and the potential $V_{bb}$ lower than the ground potential $V_{SS}$ are applied to the backgates of the respective MOS-FETs, and though the subthreshold current increases, higher switching speeds are achieved.

On the other hand, when the output buffer 35 is not in operation, the switch circuits 43C and 45C respectively output the potential $V_{PP}$ higher than the power source potential $V_{CC}$ and the potential $V_{bb}$ lower than the ground potential $V_{SS}$, which are applied to the backgates of the pMOS-FETs and nMOS-FETs, respectively, in the operating circuits. At this time, the magnitude of the threshold potential of the pMOS-FETs and nMOS-FETs is larger than that when the power source potential $V_{CC}$ and the ground potential $V_{SS}$ are applied to the backgates of the respective MOS-FETs, and the subthreshold current is reduced.

EMBODIMENT 3

Figure 14:
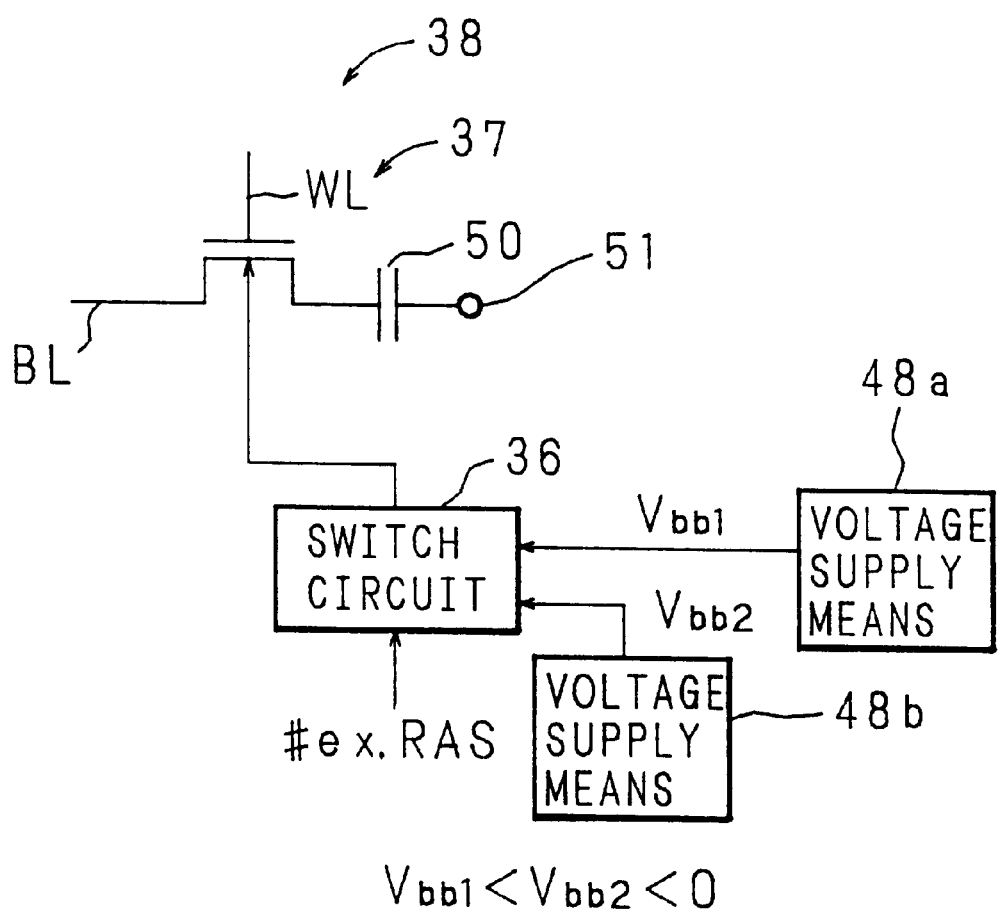
FIG. 14 is a block diagram showing a configuration of a memory cell according to a third embodiment of the present invention.

FIG. 14 is a block diagram showing the configuration of a memory cell according to a third embodiment of the present invention. One electrode of a capacitor 50 is connected to the source of an nMOS-FET 37, and the gate and drain of the nMOS-FET 37 are connected to a word line WL and a bit line BL, respectively. The other electrode of the capacitor 50 is connected to a cell plate 51. Connected to the backgate of the FET 37 is a switch circuit 36 that switches potential $V_{bb2}$ supplied from a voltage supply means 48b and potential $V_{bb1}$ supplied from a voltage supply means 48a (where $V_{bb1}<V_{bb2}$).

Figure 15:
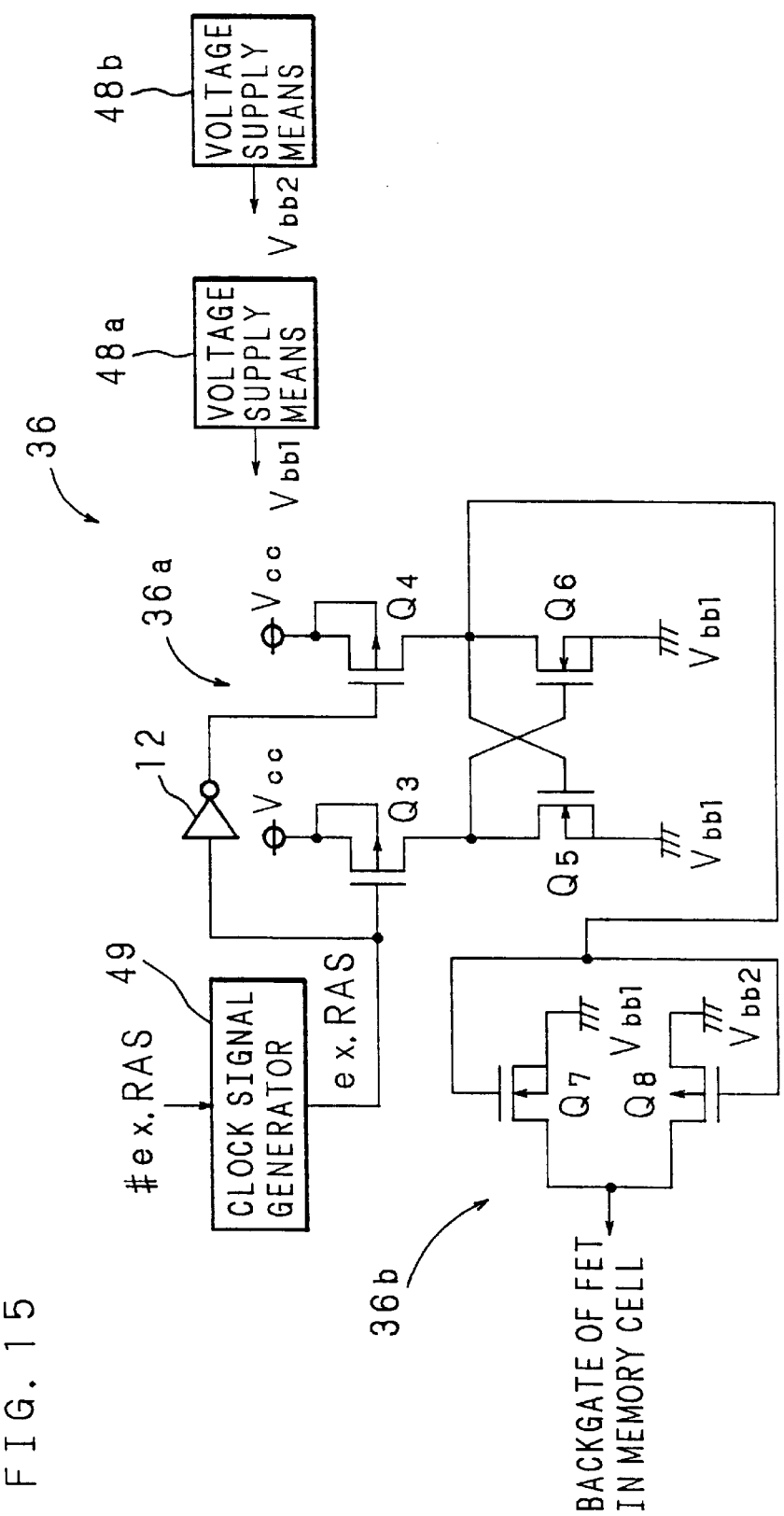
FIG. 15 is a circuit diagram showing a configurational example of a switch circuit shown in FIG. 14.

FIG. 15 is a circuit diagram showing a configurational example of the switch circuit 36, which is substantially same as the circuit diagram of the switch circuit 10 shown in FIG. 7. In FIG. 15, the voltage supply means 48a, potential $V_{bb2}$ from the voltage supply means 48b, clock signal generator 49, external RAS (row address strobe) signal (external row select signal) ex.RAS, level shift circuit 36a, and selector switch 36b, respectively correspond to the voltage supply means 13, ground potential $V_{SS}$, clock signal generator 14, control clock signal #$\phi$, level shift circuit 10a, and selector switch 10b, shown in FIG. 7. The voltage supply means 48b is added in the circuit shown in FIG. 15.

In the switch circuit 36, when a high-level external RAS signal ex.RAS is inputted from the clock signal generator 49, the potential $V_{bb1}$ is outputted, and when a low-level external RAS signal ex.RAS is inputted, the potential $V_{bb2}$ is outputted. Otherwise, the operation is same as that of the switch circuit 10 shown in FIG. 7, and description thereof will not be repeated here.

The MOS-DRAM using such memory cells 38 is almost identical in configuration to the MOS-DRAM shown in FIGS. 10 and 11, the only difference being that the switch circuit 36, voltage supply means 48a, and voltage supply means 48b are added in the configuration of the third embodiment.

In the MOS-DRAM 42 of such configuration, after the external row address signal and the inverted external RAS signal (external row select signal) #ex.RAS of low level, are inputted to the input buffer 26, the row decoder 29 selects the appropriate word line among the word lines $WL_0$–$WL_m$. When the selected word line among the word lines $WL_0$–$WL_m$ is supplied with a high level signal by the word driver 30, causing the FET 37 connected to the word line $WL_0$–$WL_m$ to conduct, the capacitor 50 is charged/discharged through the bit line BL, thereby performing a write or refresh operation/read operation.

On the other hand, when the inverted external RAS signal #ex.RAS of low level, is inputted to the clock signal generator 49, the clock signal generator 49 outputs the external RAS signal ex.RAS of high level to the switch circuit 36. When the external RAS signal ex.RAS of high level is inputted, the switch circuit 36 switches its output from the potential $V_{bb2}$ ($V_{bb2}<0$) to potential $V_{bb1}$ lower than it and switches the substrate potentials of the FETs 37 in all of the memory cells 38 of the memory cell array 33 from the potential $V_{bb2}$ ($V_{bb2}<0$) to the potential $V_{bb1}$ lower than it.

At this time, the magnitude of the threshold potential of the FETs 37 in all the memory cells 38 is larger than that when the potential $V_{bb2}$ is applied to their backgates, and the subthreshold leakage is reduced.

Accordingly, when the DRAM 42 is in the activated state with the peripheral circuits and bit lines BL in the active state, the subthreshold leakage, which is the primary cause for leakage in active state, can be reduced; therefore, the disturb refresh cycle can be made longer, allowing the refresh frequency to be reduced.

When the inverted external RAS signal (external row select signal) ex.RAS of high level, is inputted into the input buffer 26, the DRAM 42 is deactivated.

On the other hand, when the inverted external RAS signal #ex.RAS of high level, is inputted to the clock signal generator 49, the clock signal generator 49 outputs the low-level external RAS signal ex.RAS to the switch circuit 36. When this low-level external RAS signal ex.RAS is applied, the switch circuit 36 switches its output from the potential $V_{bb1}$ to the potential $V_{bb2}$, as a result of which the substrate potential of the FETs 37 in all the memory cells 38 in the memory cell array 33 is changed from $V_{bb1}$ to $V_{bb2}$.

At this time, the magnitude of the threshold potential of the FETs 37 in all the memory cells 38 is smaller than that when the potential $V_{bb1}$ lower than the potential $V_{bb2}$ is applied to their backgates, and the junction leakage is reduced.

Accordingly, when the DRAM 42 is in the deactivated state with the peripheral circuits and bit lines BL in the standby state, the junction leakage, which is the primary cause for leakage in the standby state, can be reduced; therefore, the pause refresh cycle can be made longer, allowing the refresh frequency to be reduced.

In case of a DRAM using self-refresh type memory cells wherein refreshing can be done within each individual memory cell, since the state during self-refresh is the same as during pause refresh, the self-refresh cycle can be made longer in the same manner as described above.

Furthermore, the above-described voltage supply means for the MOS-DRAM need not be internal to the MOS-DRAM, and may be replaced by terminals via which externally generated potentials are inputted to the MOS-DRAM.

EMBODIMENT 4

Figure 1:
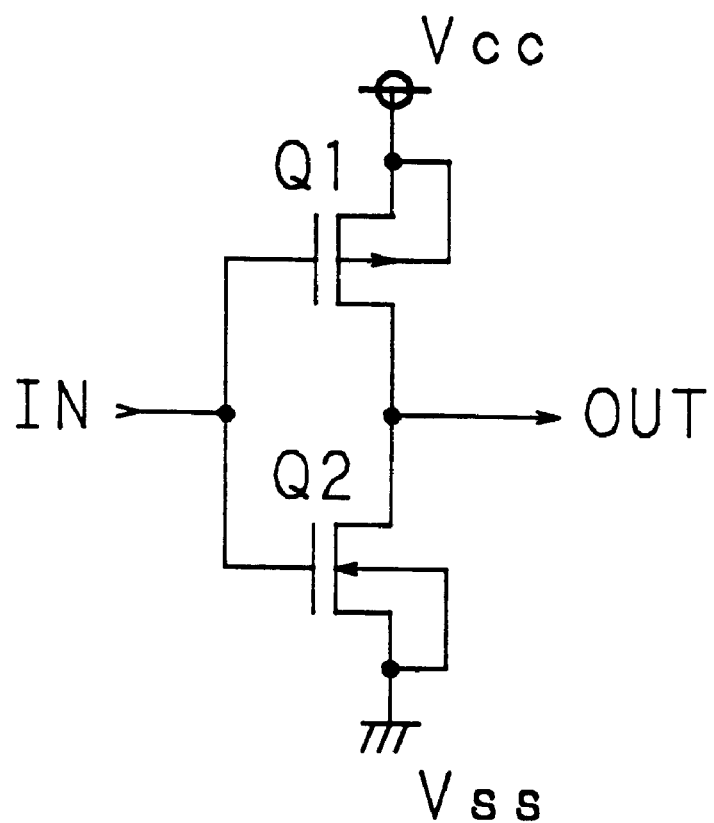
FIG. 1 is a circuit diagram showing a complementary MOS inverter used in a conventional semiconductor circuit.
Figure 2:
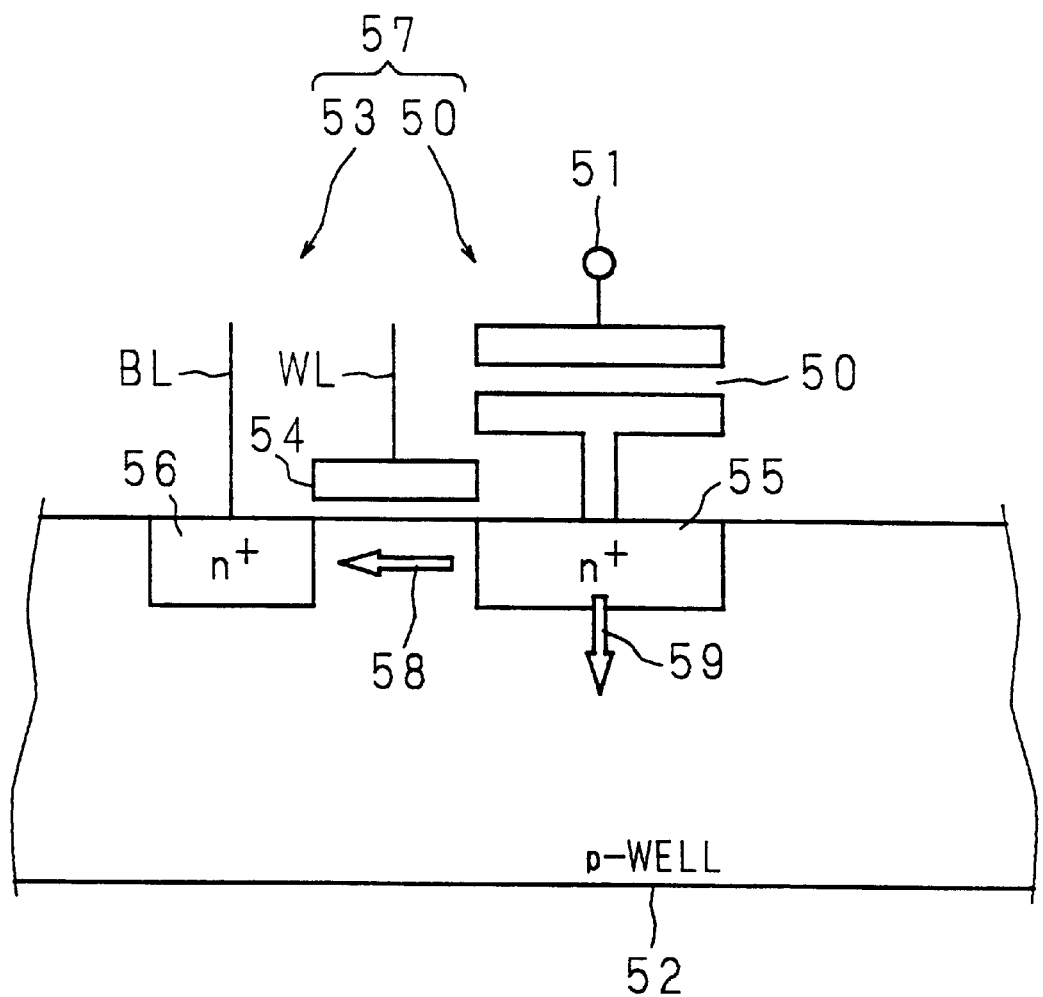
FIG. 2 is a cross-sectional view schematically showing a conventional memory cell structure used for a DRAM.
Figure 3:
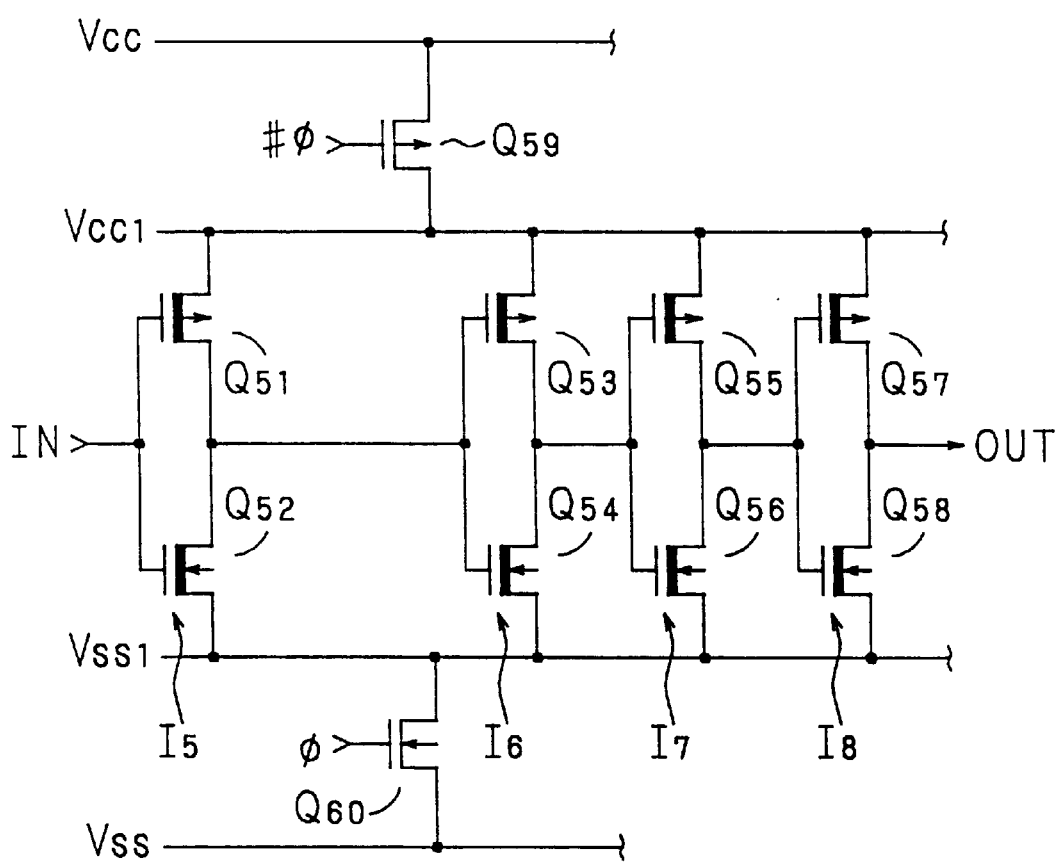
FIG. 3 is a circuit diagram showing a conventional CMOS circuit using MT-MOS.
Figure 4:
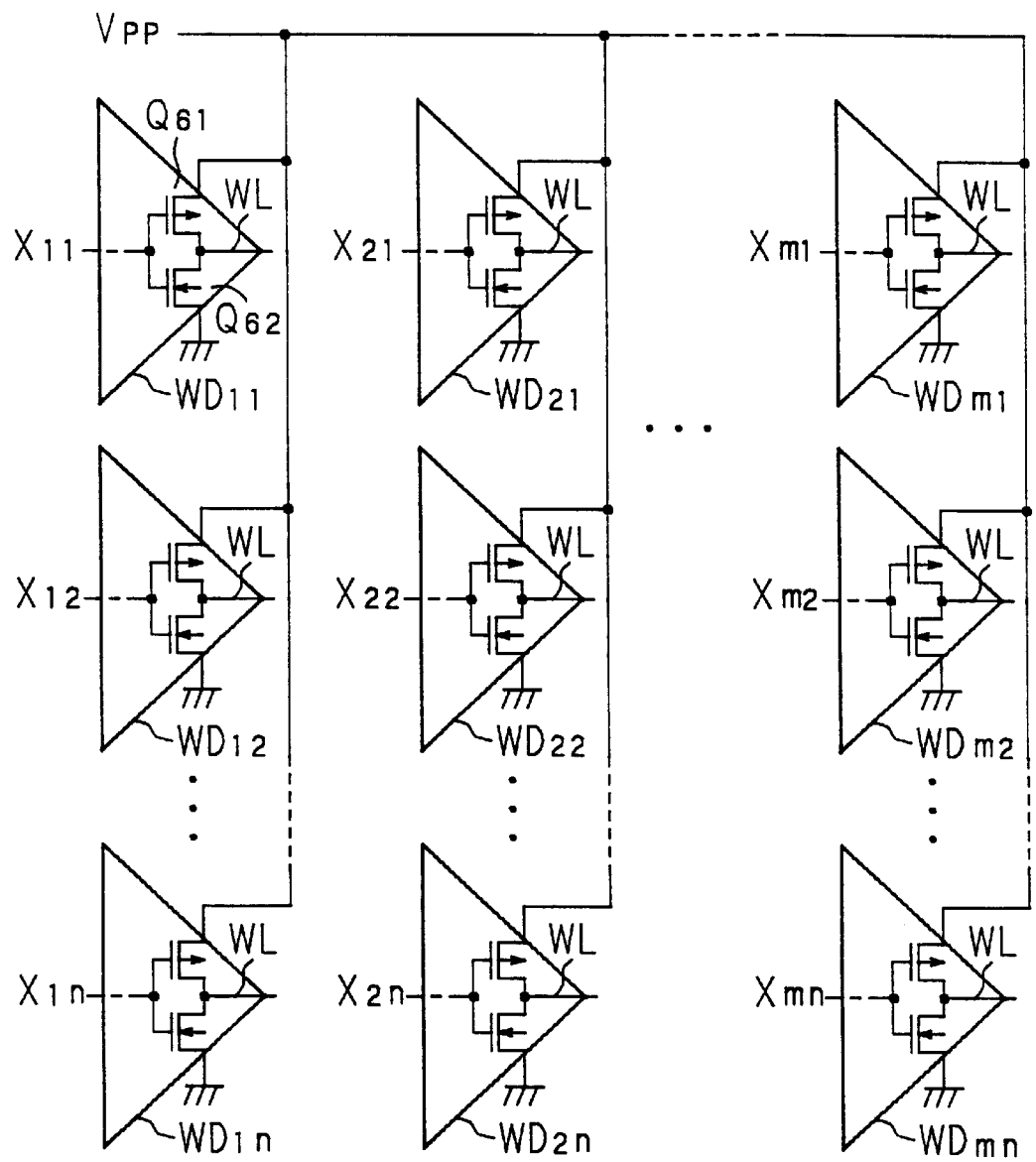
FIG. 4 is a circuit diagram showing a word driver configuration.
Figure 5:
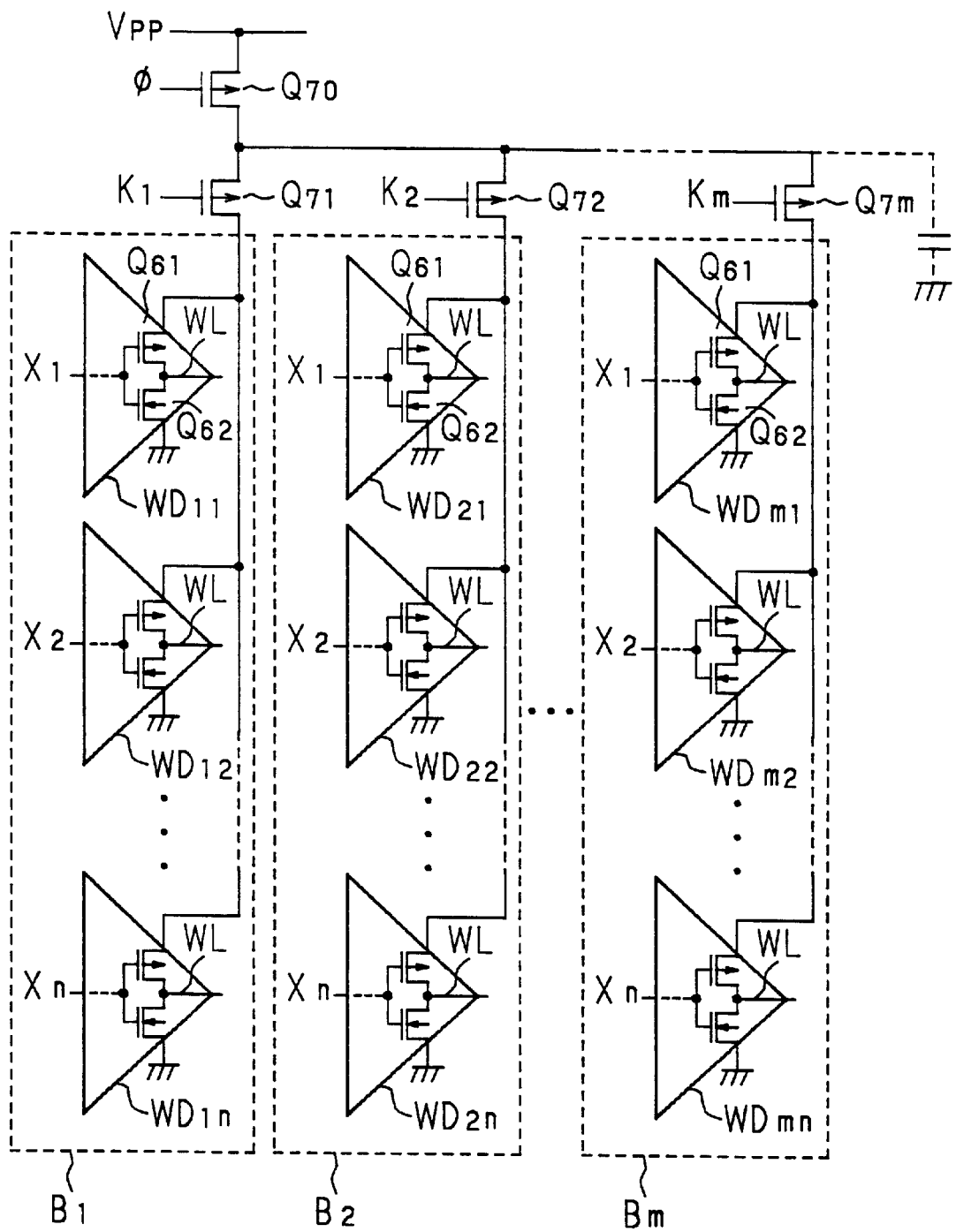
FIG. 5 is a circuit diagram showing a conventional word driver of hierarchical structure.
Figure 16:
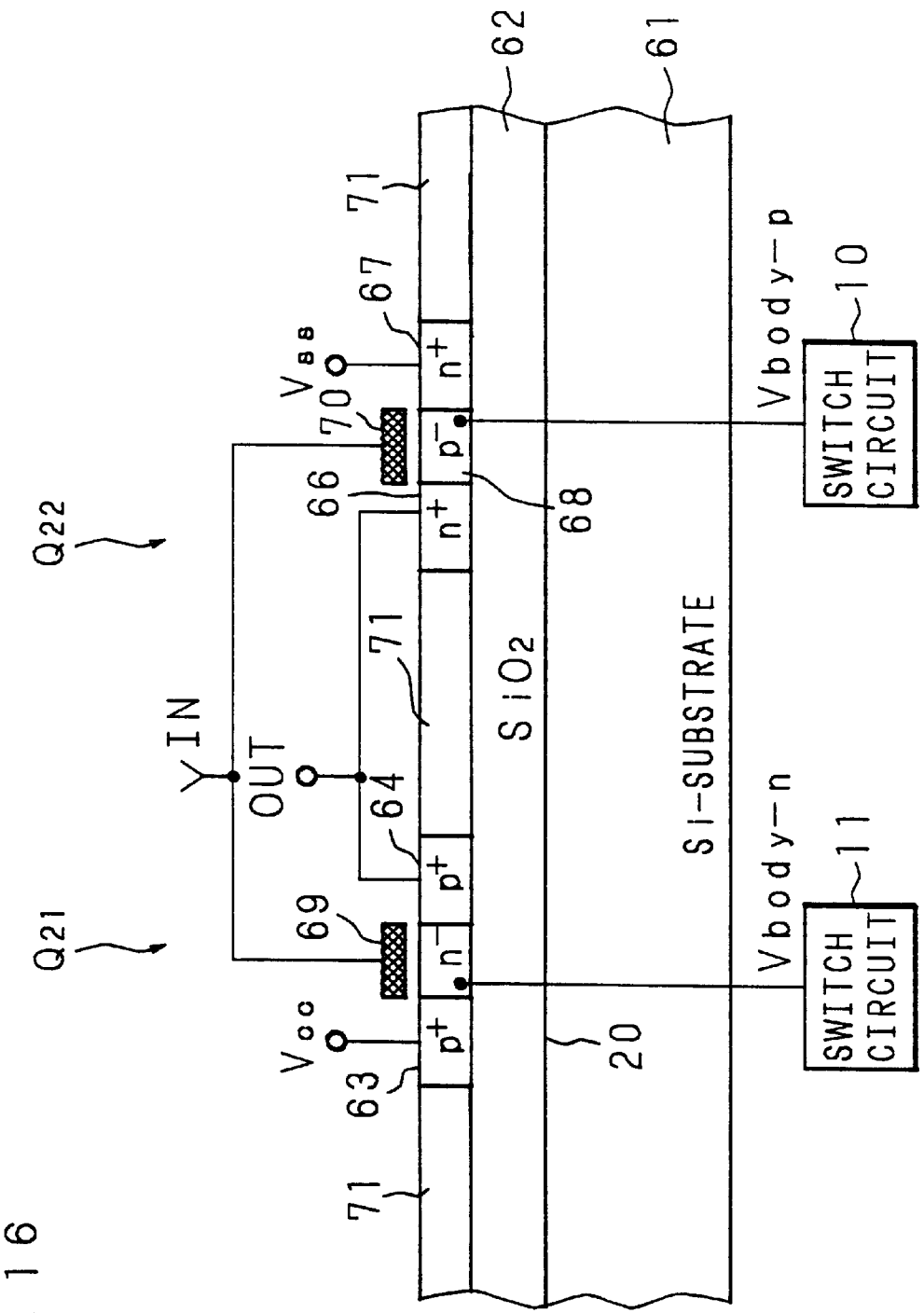
FIG. 16 is a cross-sectional view showing a structure of a logic circuit according to a fourth embodiment of the present invention.
Figure 17:
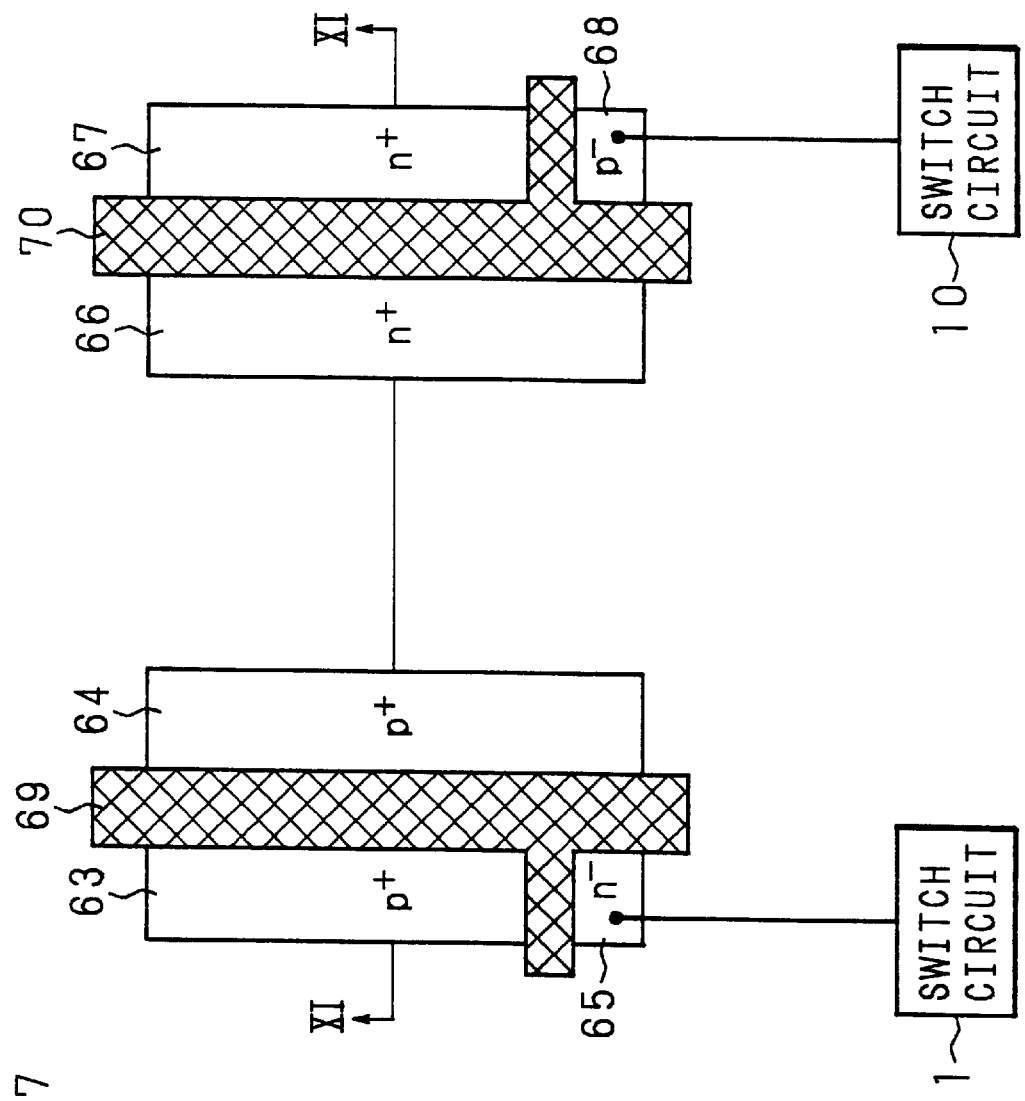
FIG. 17 is a diagram showing a layout for an essential portion of the semiconductor circuit shown in FIG. 16.

FIG. 16 is a cross-sectional view showing the structure of a logic circuit according to a fourth embodiment of the present invention, which corresponds to the diagram shown in FIG. 4. FIG. 17 shows a plan view of the logic circuit. According to this embodiment, an nMOS-FET and a pMOS-FET, of SOI structure, are formed adjacent to each other on a Si substrate. A $SiO_2$ layer 62 is formed on the Si substrate 61. In the source/drain regions of the pMOS-FET Q21 are formed $p^+$-layers 63 and 64 between which an $n^-$-channel layer 65 is formed. A $SiO_2$ layer 71 is formed between the pMOS-FET Q21 and nMOS-FET Q22; element-isolation is performed by using a LOCOS method. In the source/drain regions of the nMOS-FET Q22 are formed n -layers 66 and 67 between which a $p^-$-channel layer 68 is formed. Power source potential $V_{cc}$ is applied to the source of the pMOS-FET Q21, while ground potential $V_{SS}$ is applied to the source of the nMOS-FET Q22.

As shown in FIG. 17, the $n_-$-channel layer 65 separated from the source/drain regions by the gate electrode 69 is connected to a switch circuit 11, the same one as that shown in FIGS. 6 and 8, from which a body bias potential Vbody-n is applied. The switch circuit 11 switches the body bias potential Vbody-n to the power source potential $V_{CC}$ or raised potential $V_{PP}$. On the other hand, the $p^-$-channel layer 68 separated from the source/drain regions by the gate electrode 70 is connected to a switch circuit 10, the same one as that shown in FIGS. 6 and 7, from which a body bias potential Vbody-p is applied. The switch circuit 10 switches the body bias potential Vbody-p to the ground potential $V_{SS}$ or negative potential $V_{bb}$.

An input signal is applied to the gate electrode 69, of the pMOS-FET Q21, formed above the $n^-$-channel layer 65, and also to the gate electrode 70 of the nMOS-FET Q22, formed above the $p^-$-channel layer 68, and an output signal is derived from the drains of the pMOS-FET Q21 and nMOS-FET Q22.

The operation of the above-configured logic circuit will be described below.

When the logic circuit is not in operation, the inverted control clock signal #ø of high level is inputted to the switch circuits 10 and 11 from the clock signal generator 14; as a result, the switch circuit 10 outputs the potential $V_{bb}$ (<0) lower than the ground potential $V_{SS}$ and the switch circuit 11 outputs the potential $V_{pp}$ higher than the power source potential $V_{CC}$, and these potentials are applied to the nMOS-FET Q22 and pMOS-FET Q21 as the respective body bias potentials Vbody-p and Vbody-n. At this time, the magnitude of the threshold potential of the nMOS-FET Q22 and PMOS-FET Q21 is larger than that when the ground potential $V_{SS}$ and power source potential $V_{CC}$ are applied to the respective channel layers, and the subthreshold current is reduced.

On the other hand, when the logic circuit is in operation, an inverted control clock signal #ø of low level is inputted to the switch circuits 10 and 11 from the clock signal generator 14; as a result, the switch circuit 10 outputs the ground potential $V_{SS}$ and the switch circuit 11 outputs the power source potential $V_{CC}$, and these voltages are applied to the nMOS-FET Q22 and pMOS-FET Q21 as the respective body bias potentials Vbody-p and Vbody-n. At this time, the magnitude of the threshold potential of the nMOS-FET Q22 and pMOS-FET Q21 is smaller than that when the potential $V_{bb}$ lower than the ground potential $V_{SS}$ and the potential $V_{PP}$ higher than the power source potential $V_{CC}$ are applied to the respective channel layers, and though the subthreshold current increases, higher switching speeds are achieved.

When a logic signal of high level (power source potential $V_{CC}$) is inputted to the input node IN, the pMOS-FET Q21 is OFF and the nMOS-FET Q22 is ON, so that a logic signal of low level (ground potential $V_{SS}$0 V) is outputted from the output node OUT through the nMOS-FET Q22.

On the other hand, when a logic signal of low level (ground potential $V_{SS}$0 V) is inputted to the input node IN, the PMOS-FET Q21 is ON and the nMOS-FET Q22 is OFF, so that a logic signal of high level (power source potential $V_{CC}$) is outputted at the output node OUT through the nMOS-FET Q21.

As described above, according to this embodiment, the high-speed switching characteristic and small subthreshold current characteristic are achieved simultaneously.

In the element structure shown in FIG. 9, since the bias voltage for the bulk-structured wells having a relatively large capacitance is changed, the switching time is relatively long and the charge/discharge current associated with it is relatively large. By contrast, according to the element structure shown in FIG. 16, since the capacitances of the n⁻-channel layer 65 and p⁻-channel layer 68 are smaller than those of the wells in the bulk structure device, the switching time can be shortened and the associated charge/discharge current can be reduced to a relatively small value. Furthermore, since the body voltage is fixed, the kink inherent in SOI transistors is eliminated, providing improved voltage withstanding characteristic.

EMBODIMENT 5

Figure 18:
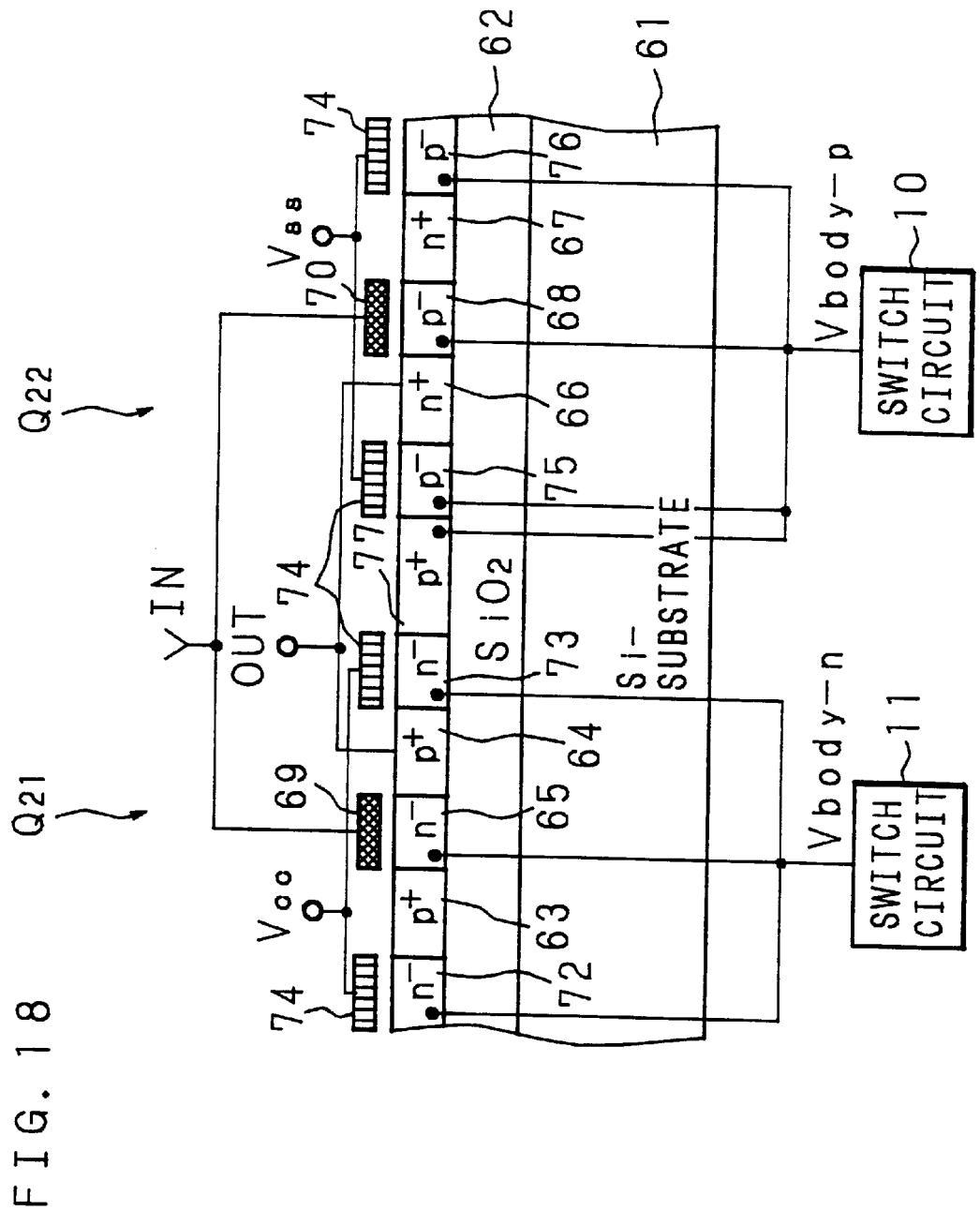
FIG. 18 is a cross-sectional view showing a structure of a logic circuit according to a fifth embodiment of the present invention.

FIG. 18 is a cross-sectional view showing the structure of a logic circuit according to a fifth embodiment of the present invention. In this embodiment, element-isolation between the pMOS-FET Q21 and nMOS-FET Q22 is accomplished using a field-shield (FS) method instead of LOCOS method. More specifically, on the outer sides of the p⁺-layers 63 and 64 of the pMOS-FET Q21 are formed polysilicon FS layers 74 and 74, and by applying 0 V, the channel is cut off and n⁻-layers 72 and 73 are formed. Likewise, on the outer sides of the n⁺-layers 66 and 67 of the nMOS-FET Q22 are formed FS layers 74 and 74, and by applying a negative bias, the channel is cut off and p⁻-layers 75 and 76 are formed. A p⁺-layer 77 is formed between the n⁻-layer 73 and the p⁻-layer 75.

Body bias potential Vbody-n is applied to the n⁻-layers 72, 73 as well as to the n⁻-channel layer 65 from the switch circuit 11. Likewise, body bias potential Vbody-p is applied to the p⁺-layer 77 and p⁻-layers 75, 76 as well as to the p⁻-channel layer 68 from the switch circuit 10. Power source potential $V_{CC}$ is applied to the FS layers 74, 74 of the pMOS-FET Q21, and ground potential $V_{SS}$ is applied to the FS layers 74, 74 of the nMOS-FET Q22. Otherwise, the structure is same as that shown in FIG. 16; the same parts are designated by the same reference numerals, and further description thereof is omitted here.

Also in this embodiment, the same effect as that provided by the foregoing embodiment can be obtained. Furthermore, this embodiment does not require the layout for body bias application such as shown in FIG. 17, and the potential can be fixed by means of the n⁻-layers 72, 73 or p⁻-layers 75, 76 underlying the FS layers 74.

Alternatively, an n⁺-layer may be formed between the n⁻-layer 73 and the p⁻-layer 75, in which case the body bias potential Vbody-n is applied to this n⁺-layer.

EMBODIMENT 6

Figure 19:
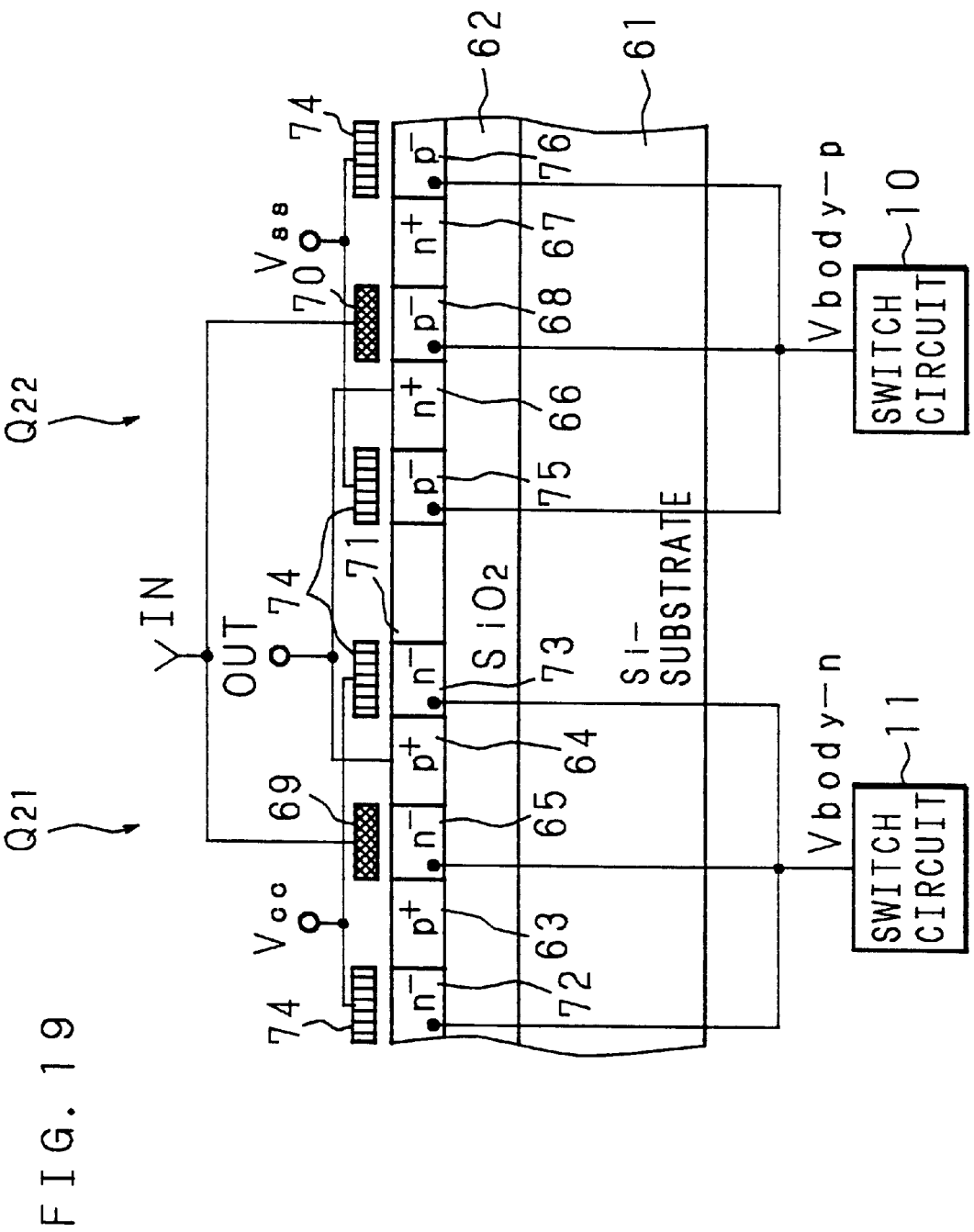
FIG. 19 is a cross-sectional view showing a structure of a logic circuit according to a sixth embodiment of the present invention.

FIG. 19 is a cross-sectional view showing the structure of a logic circuit according to a sixth embodiment of the present invention. In this embodiment, element-isolation is accomplished by using FS and LOCOS methods. That is, a $SiO_2$ layer 71 is formed instead of the p⁺-layer 77 shown in FIG. 18. Body bias potential Vbody-n is applied to the n⁻-channel layer 65 and n⁻-layers 72, 73 from the switch circuit 11. Further, body bias potential Vbody-p is applied to the p⁻-channel layer 68 and p⁻-layers 75, 76 from the switch circuit 10. Otherwise, the structure is same as that shown in FIG. 18; the same parts are designated by the same reference numerals, and further description thereof is omitted here.

Thus, the present invention can also be applied to the case where the element-isolation is provided using FS and LOCOS methods. Also in this case, the same effect as that provided by the foregoing embodiments can be obtained.

EMBODIMENT 7

Figure 20:
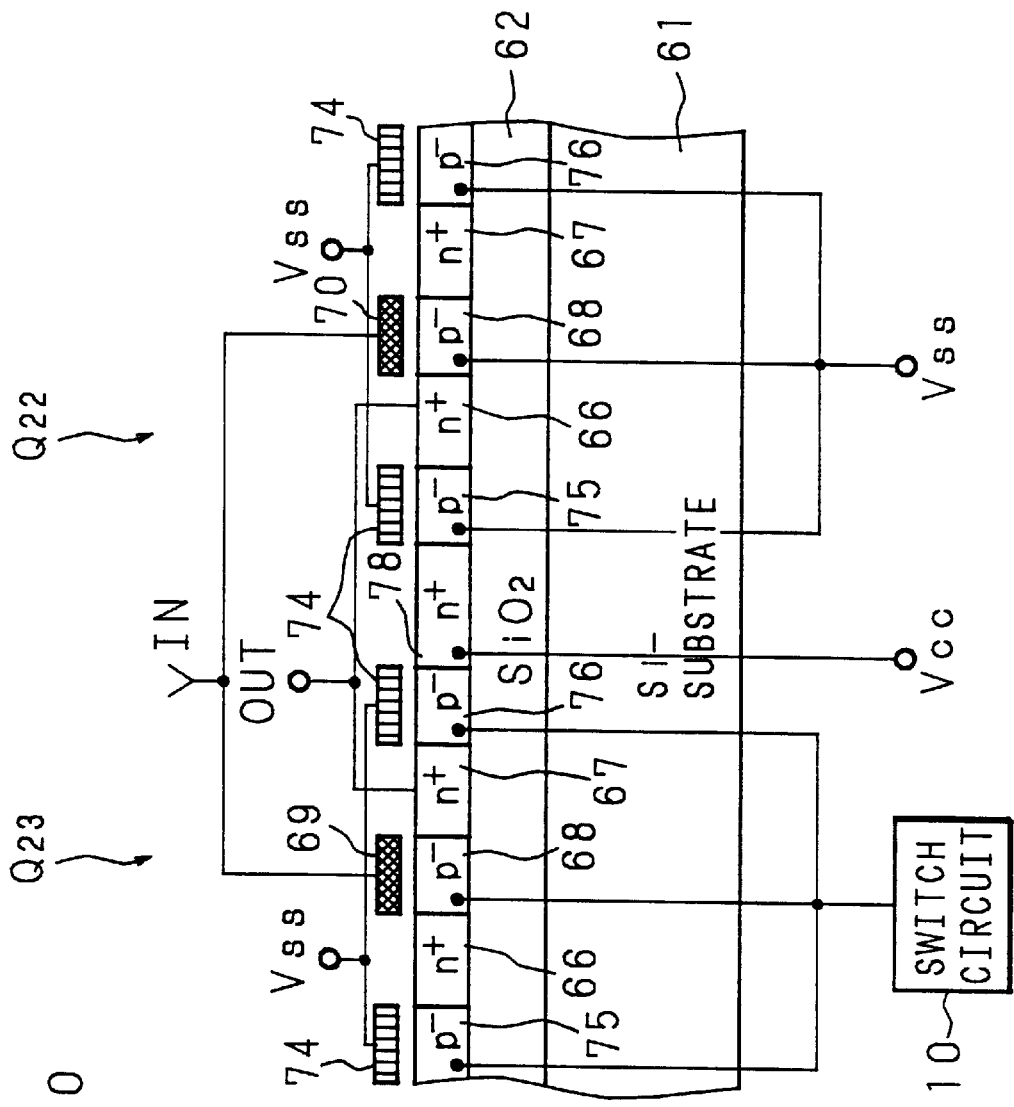
FIG. 20 is a cross-sectional view showing a structure of a logic circuit according to a seventh embodiment of the present invention.

FIG. 20 is a cross-sectional view showing the structure of a logic circuit according to a seventh embodiment of the present invention. In this embodiment the pMOS-FET Q21 is replaced by an nMOS-FET Q23 that is identical in structure to the nMOS-FET Q22. An n⁺-layer 78 is formed between the two nMOS-FETs Q22 and Q23. Ground potential $V_{SS}$ is applied to the FS layers 74, 74, 74, 74 of the nMOS-FETs Q22, Q23 and also to the p⁻-layers 75, 76 and p⁻-channel layer 68 of the nMOS-FET Q22; on the other hand, power source potential $V_{CC}$ is applied to the n⁺-layer 78. The p⁻-layers 75, 76 and p⁻-channel layer 68 of the nMOS-FET Q23 are connected to the switch circuit 10. Otherwise, the structure is same as that shown in FIG. 18; the same parts are designated by the same reference numerals, and further description thereof is omitted here.

Thus, the present invention can also be applied to the case where two nMOS-FETs are formed adjacent to each other as described above. Also in this case, the same effect as provided by the foregoing embodiments can be obtained.

Each of the above embodiments has been described assuming that power source potential $V_{CC}$<potential $V_{PP}$, potential $V_{bb}$<ground potential $V_{SS}$, and potential $V_{bb1}$<potential $V_{bb2}$, but these relationships are only relative, and the same description hitherto given can also apply when power source potential $V_{CC}$>potential $V_{PP}$, potential $V_{bb}$>ground potential $V_{SS}$, and potential $V_{bb1}$>potential $V_{bb2}$.

EMBODIMENT 8

Figure 21:
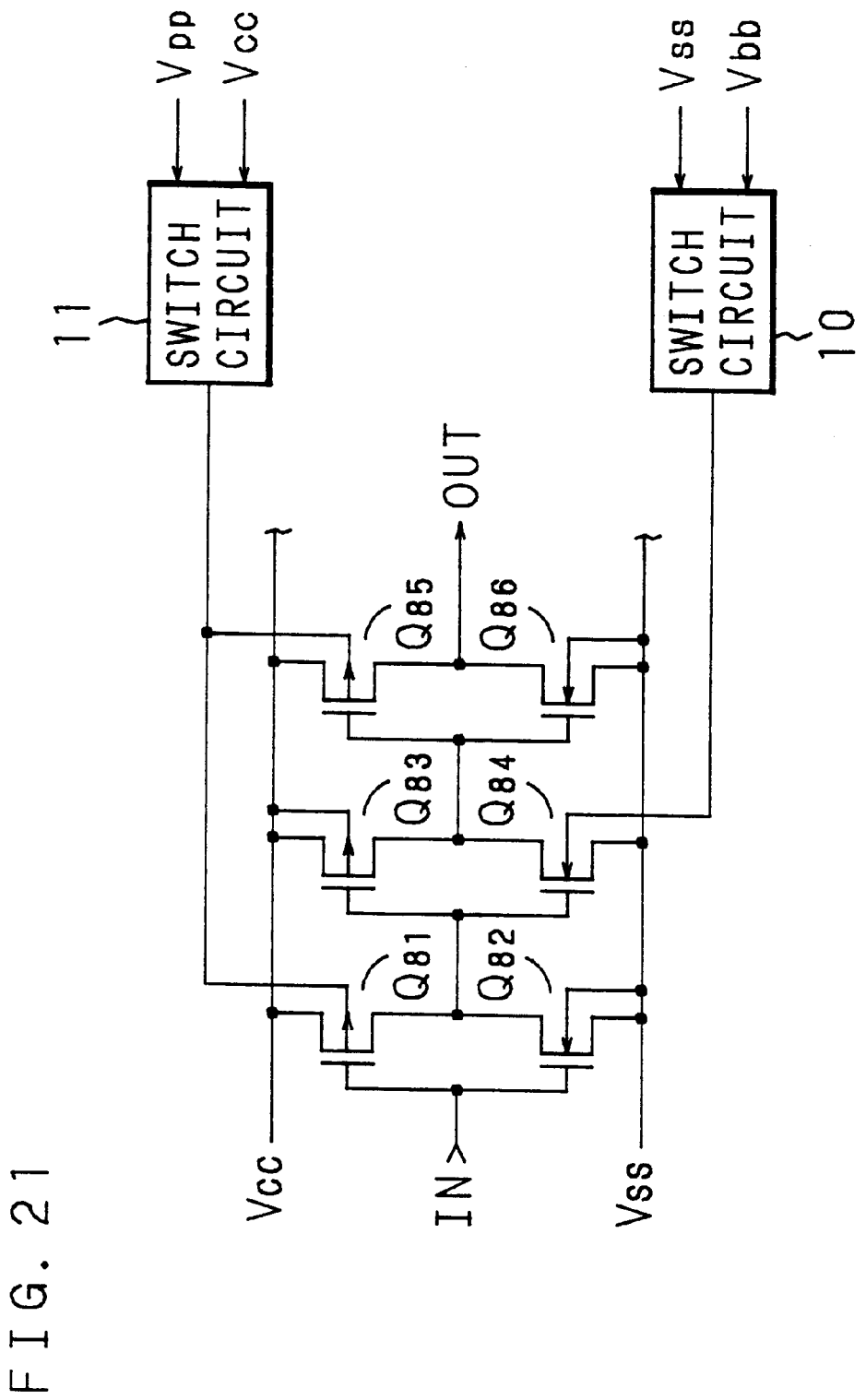
FIG. 21 is a block diagram showing an inverter array according to an eighth embodiment of the present invention.

FIG. 21 is a block diagram showing an eighth embodiment of the semiconductor circuit according to the present invention. FIG. 21 shows the occasion where inverters $I_{11}$, $I_{12}$ and $I_{13}$ each of which consists of FETs having a bulk structure where wells are formed are connected in series. The inverter $I_{11}$ consists of a pMOS-FET Q81 and an nMOS-FET Q82 connected in series between a power supply line $V_{CC}$ (power source potential: $V_{CC}$) and a ground line $V_{SS}$ (ground potential: $V_{SS}$). Likewise, the inverter $I_{12}$ ($I_{13}$) consists of a pMOS-FET Q83 (Q85) and an nMOS-FET Q84 (Q86) connected in series between the power supply line $V_{CC}$ and the ground line $V_{SS}$.

The gates of the pHOS-FET Q81 and nMOS-FET Q82 are connected to form an input node IN. The drains of the pMOS-FET Q81 and nMOS-FET Q82 are connected, and their node is connected to the node between the gates of the pMOS-FET Q83 and nMOS-FET Q84 in the inverter $I_{12}$. Similarly, the node between the drains the pMOS-FET Q83 and nMOS-FET Q84 is connected to the node between the gates of the pMOS-FET Q85 and nMOS-FET Q86 in the inverter $I_{13}$, and the node between the drains of the pMOS-FET Q85 and nMOS-FET Q86 forms an output node OUT.

The backgates of the pMOS-FETs Q81, Q85 are connected to the switch circuit 11 which switches between supply voltage $V_{CC}$ and the voltage $V_{pp}$ the backgate of the pMOS-FET Q33 is connected to the same power supply line $V_{CC}$ that their sources are. The backgates of the nMOS-FETs Q82, Q86 are connected to the same ground line $V_{SS}$ that their sources are connected to, the backgate of the nMOS-FET Q84 is connected to the switch circuit 10 which switches between the ground potential $V_{ss}$ and the potential $V_{bb}$.

In standby state, the clock signal applied at the input node IN is "H". The potential $V_{pp}$ is applied to the backgates of the pMOS FETs Q81 and Q85 from the switch circuit 11, and the supply voltage $V_{cc}$ is applied to the backgate of the pMOS-FET Q83. While the ground potential $V_{ss}$ is applied to the backgates of nMOS-FETs Q82 and Q86, and the potential $V_{bb}$ is applied to the backgate of nMOS-BETs Q84 from the switch circuit 10.

In active state, the clock signal applied at the input node IN is "L". The supply voltage $V_{cc}$ from the switch circuit 11 is applied to the backgates of the FETs Q81 and Q85, and the same supply voltage $V_{cc}$ is applied to the backgate of the FET Q83 as to its source. While the same ground potential $V_{ss}$ is applied to the backgates of the FETs Q82 and Q86 as to their sources, and the ground potential $V_{ss}$ from the switch circuit 10 is applied to the backgate of the FET Q84.

As described above, by controlling the potential applied to the backgates, the threshold voltages of the pMOS-FETs Q81 and Q85 which are off in standby mode are bigger than those in active mode, and the threshold voltage of the nMOS-FET Q84 which is off in standby mode is bigger than that in active mode. This serves to reduce the subthreshold current which flows in the FETs being off in standby mode. Further, the inverter array can operate at high speed by sealing the threshold voltage of the low voltage circuits.

EMBODIMENT 9

Figure 22:
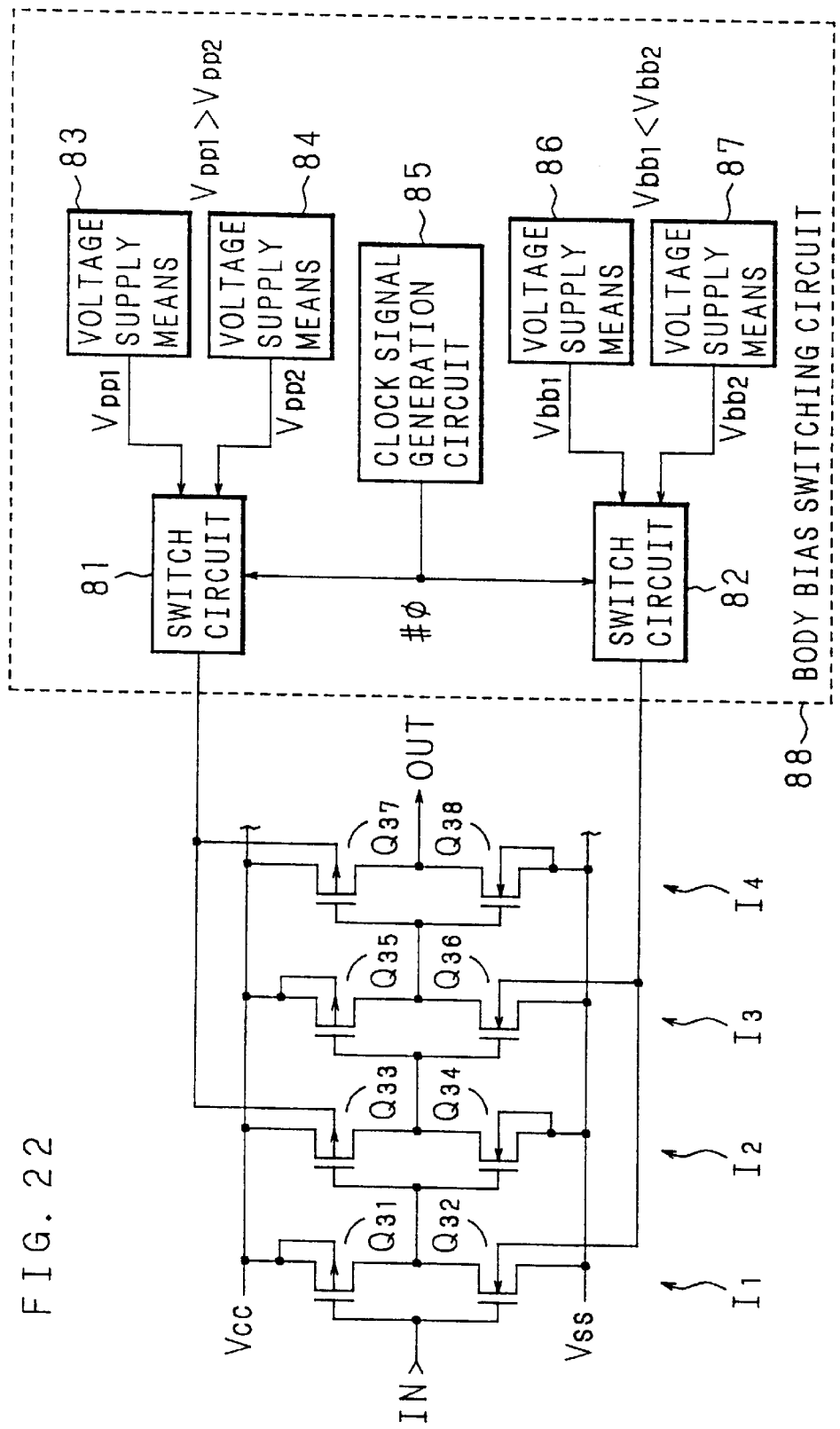
FIG. 22 is a block diagram showing an inverter array according to a ninth embodiment of the present invention.

FIG. 22 is a block diagram showing a ninth embodiment of the semiconductor circuit according to the present invention. In the configuration shown in FIG. 22, four inverters $I_1$, $I_2$, $I_3$, and $I_4$ each of which consists of FETs of the SOI structure are connected in series. The inverter $I_1$ consists of a pMOS-FET Q31 and an nMOS-FET Q32 connected in series between a power supply line $V_{CC}$ (power source potential: $V_{CC}$) and a ground line $V_{SS}$ (ground potential: $V_{SS}$). Likewise, the inverter $I_2$ ($I_3$, $I_4$) consists of a pMOS-FET Q33 (Q35, Q37) and an nMOS-FET Q34 (Q36, Q38) connected in series between the power supply line $V_{CC}$ and the ground line $V_{SS}$.

The gates of the pMOS-FET Q31 and nMOS-FET Q32 are connected to form an input node IN. The drains of the pMOS-FET Q31 and nMOS-FET Q32 are connected, and their node is connected to the node between the gates of the pMOS-FET Q33 and nMOS-FET Q34 in the inverter $I_2$. Similarly, the node between the drains the pMOS-FET Q33 and nMOS-FET Q34 is connected to the node between the gates of the pMOS-FET Q35 and nMOS-FET Q36 in the inverter $I_3$, and the node between the drains of the pMOS-FET Q35 and nMOS-FET Q36 is connected to the node between the gates of the pMOS-FET Q37 and nMOS-FET Q38 in the inverter $I_4$. The node between the drains of the pMOS-FET Q37 and nMOS-FET Q38 forms an output node OUT.

The bodies, which include channel layers and channel-off layers under the FS layers, of the pMOS-FETs Q31, Q35 are connected to the same power supply line $V_{CC}$ to which their sources are connected to, while the bodies of the nMOS-FETs Q34, Q38 are connected to the same ground line $V_{SS}$ that their sources are connected to. Further, the bodies of the pMOS-FE s Q33, Q37 are connected to a switch circuit 81 which selectively supplies a potential $V_{PP1}$ or potential $V_{PP2}$ ($V_{PP1}>V_{PP2}$) while the bodies of the nMOS-FETs Q32, Q36 are connected to a switch circuit 82 which selectively supplies a potential $V_{bb1}$ or $V_{bb2}$ ($V_{bb1}<V_{bb2}$).

Potential $V_{PP1}$ from voltage supply means 83 and potential $V_{PP2}$ from voltage supply means 84 are supplied to the switch circuit 81, which is also supplied with an inverted clock signal #ø from a clock signal generating circuit 85. Potential $V_{bb1}$ from voltage supply means 86 and potential $V_{bb2}$ from voltage supply means 87 are supplied to the switch circuit 82, which is also supplied with the inverted clock signal #ø from the clock signal generating circuit 85. The circuit including the switch circuits 81 and 82, the voltage supply means 83, 84, 86, and 87, and the clock signal generating circuit 85, is called a body bias switching circuit 88.

The switch circuit 82 is identical to the one shown in FIG. 15, except that the external RAS signal ex.RAS in FIG. 15 is replaced by the clock signal (ø or #ø) generated by the clock signal generating circuit 85. The output side of the selector switch (36b) is connected to the bodies of the nMOS-FETs Q34, Q38. Either the potential $V_{bb1}$ or $V_{bb2}$ may be chosen as the ground potential $V_{SS}$. When the potential $V_{bb2}$ is chosen as the ground potential $V_{SS}$, the configuration is same as that shown in FIG. 7. In that case, it is required that $V_{bb1}<V_{bb2}$.

The switch circuit 81 is identical to the one shown in FIG. 8, except that the voltage supply means 15 in FIG. 8 is replaced by the voltage supply means 83 to supply the potential $V_{PP1}$ instead of the potential $V_{PP}$, and that the power source potential $V_{CC}$ shown in FIG. 8 is replaced by the potential $V_{PP2}$ supplied from the voltage supply means 84. Either the potential $V_{PP1}$ or $V_{PP2}$ may be chosen as the power source potential $V_{CC}$. When the potential $V_{PP2}$ is chosen as the power source potential $V_{CC}$, the configuration is same as that shown in FIG. 8. In that case, it is required that $V_{PP1}>V_{PP2}$.

The operation of the above-configured semiconductor circuit will be described below.

In the standby state, the input signal inputted to the input node IN is in low level, and the body potentials of the FETs Q31, Q34, Q35, and Q38 conducting in the standby state are equal to their source potentials. On the other hand, the body potentials of the nMOS-FETs Q32 and Q36 nonconducting in the standby state are held at the potential $V_{bb1}$, while those of the pMOS-FETs Q33 and Q37 are held at the potential $V_{PP1}$.

In the active state, the input signal inputted to the input node IN is in high level, which causes the FETs Q32, Q33, Q36, and Q37 to conduct. At this time, the potential $V_{bb2}$ from the body bias switching circuit 88 is applied to the bodies of the nMOS-FETs Q32 and Q36, while the potential $V_{PP2}$ from the body bias switching circuit 88 is supplied to the bodies of the pMOS-FETs Q33 and Q37. On the other hand, the body potentials of the nonconducting FETs Q31, Q34, Q35, and Q38 are equal to their source potentials.

As in the first embodiment, in the standby state the body potentials of the nMOS-FETs are held at lower values and those of the pMOS-FETs at higher values than in the active state, thereby raising their threshold voltages in the standby state. This serves to reduce the subthreshold current. In the active state, the threshold voltages are lowered so that the switching speed of the inverter array can be increased.

In the present embodiment, instead of controlling the body potentials of all the FETs in the inverter array, the body potentials only of the FETs Q32, Q33, Q36, and Q37 which are nonconducting in the standby state are controlled by connecting them to the body bias switching circuit 88. Accordingly, the current consumption associated with the substrate potential switching is reduced by half as compared to the case where the body potentials of all the FETs are controlled. Also, the body potential switching speed is higher.

When the inverter array shown in FIG. 21 is to be fabricated by using the bulk structure shown in FIG. 9 where wells are formed, four wells will be needed since there are four varieties of substrate potentials. This will involve problems, such as increased layout area due to isolation between the wells, and large amounts of charge and discharge for capacitances of the wells. On the other hand, when the inverter array is constructed by using MOS-FETs of the SOI structure such as shown in FIG. 16, the above problems will not occur. Therefore good efficiency is obtained when the present embodiment be applied to the inverter array fabricated from MOS-FETs of the SOI structure. The embodiment thus can realize a logic circuit in which the threshold voltage is low and standby current is reduced (subthreshold current), and which operates at high-speed.

EMBODIMENT 10

Figure 23:
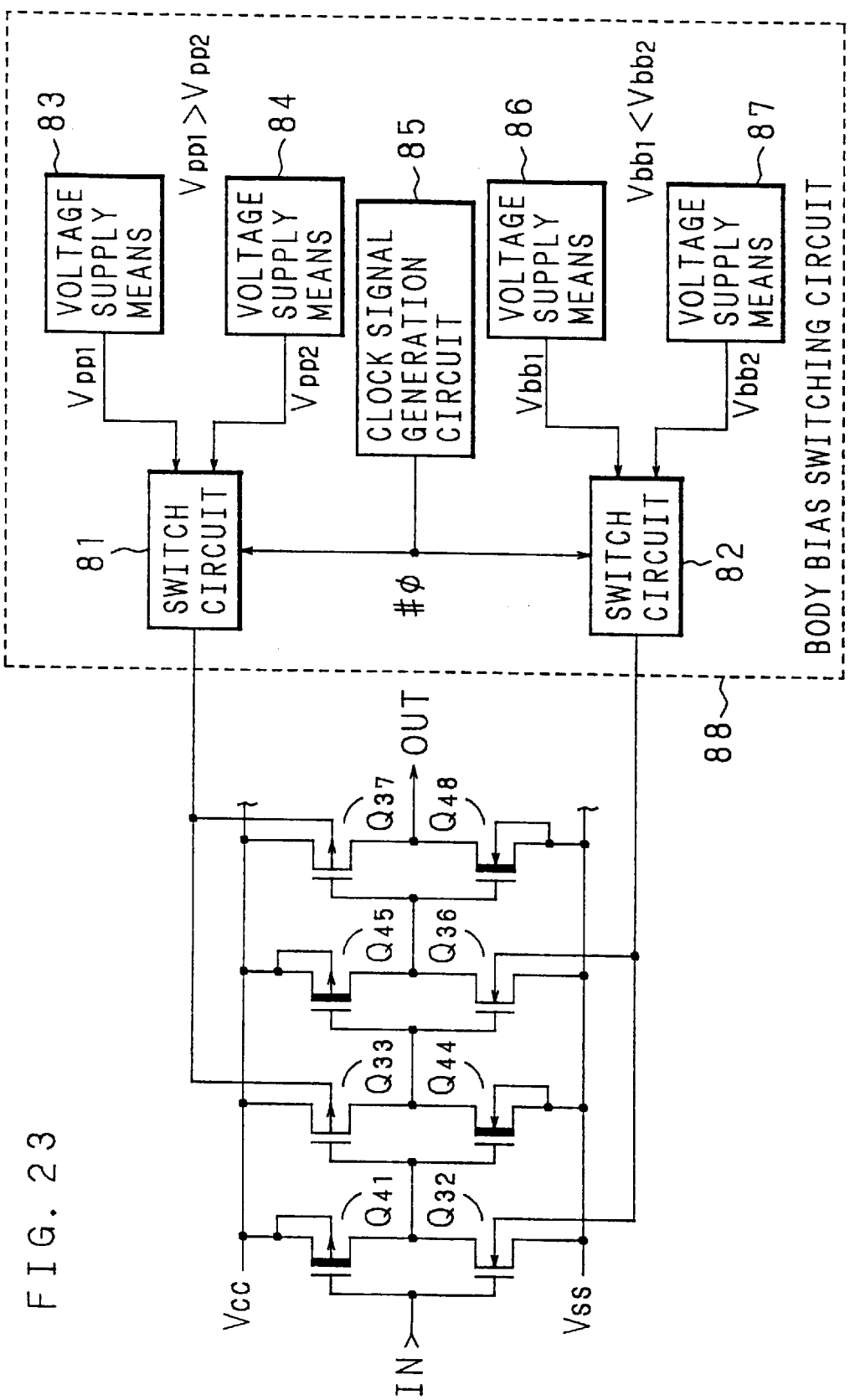
FIG. 23 is a block diagram showing an inverter array according to a 10th embodiment of the present invention.

FIG. 23 is a block diagram showing a 10th embodiment of the semiconductor circuit according to the present invention. In this embodiment, the pMOS-FETs Q31 and Q35 (threshold voltage 0.7 V, for example) in the ninth embodiment are replaced by lower threshold pMOS-FETs Q41 and Q45 (0.3 to 0.4 V, for example); furthermore, the nMOS-FETs Q34 and Q38 (threshold voltage 0.7 V, for example) are replaced by lower threshold nMOS-FETs Q44 and Q48 (0.3 to 0.4 V, for example). Otherwise, the configuration is the same as that shown in FIG. 22; the same parts are designated by the same reference numerals, and further description thereof is omitted here. The FETs may have the bulk structure.

In this embodiment, since the threshold voltages of the FETs Q1, Q44, Q45, and Q48 that are conducting in the active state are lowered, current flows instantaneously in transiting from the standby to the active state. Accordingly, the switching speed is higher than that achieved by the ninth embodiment.

EMBODIMENT 11

Figure 24:
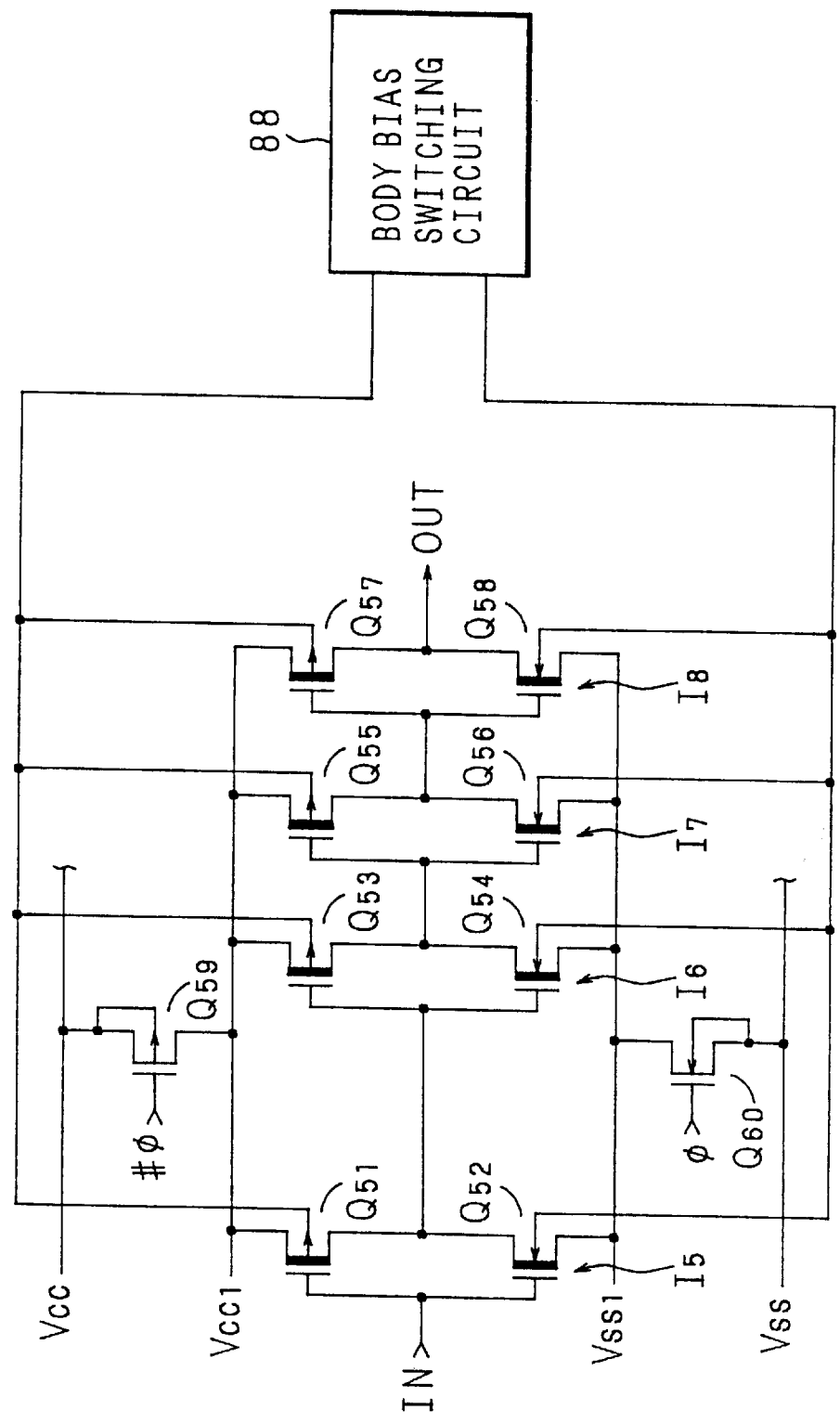
FIG. 24 is a block diagram showing an inverter array according to an 11th embodiment of the present invention.

FIG. 24 is a block diagram showing a 11th embodiment of the semiconductor circuit according to the present invention. This embodiment uses four inverters $I_5$, $I_6$, $I_7$, and $I_8$ that are fabricated using the MT-MOS structure. The gates of a pMOS-FET Q51 and an nMOS-FET Q52 in the inverter $I_5$ are connected to form an input node IN, while the node between the drains of the pMOS-FET Q51 and nMOS-FET Q52 is connected to the node between the gates of a pMOS-FET Q53 and an nMOS-FET Q54 in the inverter $I_6$. Likewise, the node between the drains of the pMOS-FET Q53 and nMOS-FET Q54 is connected to the node between the gates of a pMOS-FET Q55 and an nMOS-FET Q56 in the inverter $I_7$, and the node between the drains of the pMOS-FET Q55 and nMOS-FET Q56 is connected to the node between the gates of a pMOS-FET Q57 and an nMOS-FET Q58 in the inverter $I_8$. Further, the drains of the PMOS-FET Q57 and nMOS-FET Q58 are connected to form an output node OUT.

The sources of the pMOS-FETs Q51, Q53, Q55, and Q57 are connected to a secondary power supply line $V_{CC1}$, while the sources of the nMOS-FETs Q52, Q54, Q56, and Q58 are connected to a secondary ground line $V_{SS1}$. The secondary power supply line $V_{CC1}$ is connected to a power supply line $V_{CC}$ via a pMOS-FET Q59 to whose gate is supplied with an inverted clock signal #ø, and whose body (or backgate) is connected to power source potential $V_{CC}$. The secondary ground line $V_{SS1}$ is connected to a ground line $V_{SS}$ via an nMOS-FET Q60 to whose gate is supplied with a clock signal ø, and whose body (or backgate) is connected to ground potential $V_{SS}$. The threshold voltages of the FETs Q59 and Q60 are chosen to be higher than the threshold voltages of the FETs Q51, Q52, Q53, Q54, Q55, Q56, Q57, and Q58 forming the inverters $I_5$, $I_6$, $I_7$, and $I_8$.

The bodies (or backgates) of the pMOS-FETs Q51, Q53, Q55, and Q57 are connected to the switch circuit (81) in the body (substrate) bias switching circuit 88, while the bodies (or backgates) of the nMOS-FETs Q52, Q54, Q56, and Q58 are connected to the switch circuit (82) in the body (substrate) bias switching circuit 88.

In the above-configured semiconductor circuit, the FETs Q59 and Q60 are nonconducting in the standby state. This disconnects the secondary power supply line $V_{CC1}$ from the power source potential $V_{CC}$, and the secondary ground line $V_{SS1}$ from the ground potential $V_{SS}$. Further, to the bodies (or backgates) of the pMOS-FETs Q51, Q53, Q55, and Q57 the potential $V_{PP1}$ is supplied, while to the bodies (or backgates) of the nMOS-FETs Q52, Q54, Q56, and Q58, the potential $V_{bb1}$ is supplied.

In the active state, the FETs Q59 and Q60 are caused to conduct. Accordingly, the sources of the pMOS-FETs Q51, Q53, Q55, and Q57 are supplied with the power source potential $V_{CC}$ via the secondary power supply line $V_{CC1}$, and the sources of the nMOS-FETs Q52, Q54, Q56, and Q58 are supplied with the ground potential $V_{SS}$ via the secondary ground line $V_{SS1}$. Further, the bodies (or backgates) of the pMOS-FETs Q51, Q53, Q55, and Q57 are supplied with the potential $V_{PP2}$, while the bodies (or backgates) of the nMOS-FETs Q52, Q54, Q56, and Q58 are supplied with the potential $V_{bb2}$.

In the present invention, the substrate potentials of the FETs are controlled so that their threshold voltages in the standby state are raised even when the potentials of the secondary power supply line $V_{CC1}$ and secondary ground line $V_{SS}$ vary because of the current flowing through the inverter array. This prevents switching delays and logic changes.

EMBODIMENT 12

Figure 25:
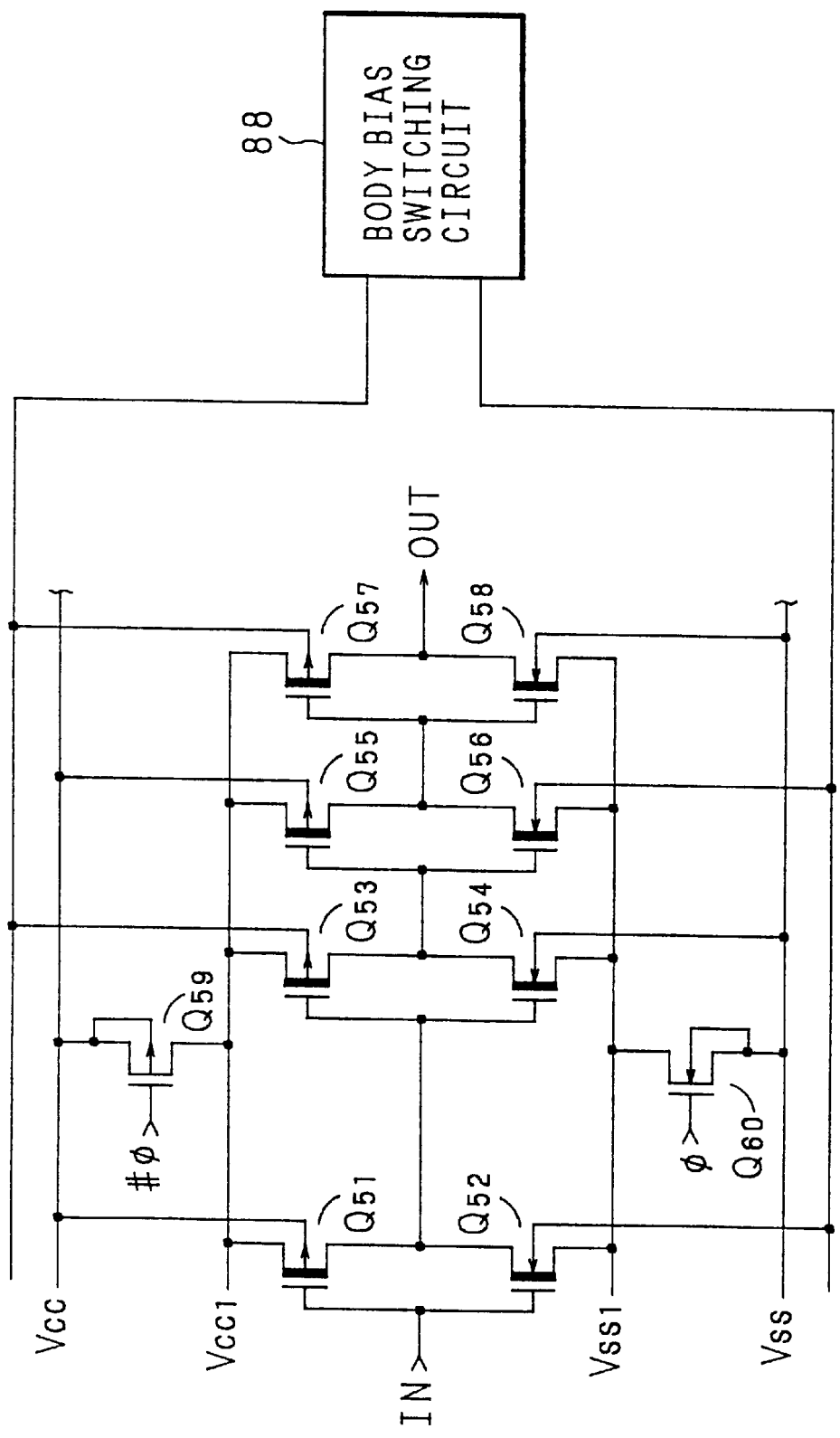
FIG. 25 is a block diagram showing a word driver according to a 12th embodiment of the present invention.

FIG. 25 is a block diagram showing an 12th embodiment of the semiconductor circuit according to the present invention. In this embodiment, the bodies (or backgates) of the pMOS-FETs Q51 and Q55 shown in FIG. 24 are connected to the power supply line $V_{CC}$, and the bodies (or backgates) only of the pMOS-FETs Q53 and Q57 are connected to the body (substrate) bias switching circuit 88. Likewise, the bodies (or backgates) of the nMOS-FETs Q54 and Q58 shown in FIG. 24 are connected to the ground line $V_{SS}$, and the backgates only of the nMOS-FETs Q52 and Q56 are connected to the body (substrate) bias switching circuit 88. Otherwise, the configuration is same as that shown in FIG. 24; the same parts are designated by the same reference numerals, and further description thereof is omitted here.

In this embodiment, the body (or substrate) bias voltages only for the FETs Q52, Q53, Q56, and Q57 that are conducting in the standby state are made variable. Thereby, the number of FETs which change the body (or substrate) bias voltage by the body (substrate) bias switching circuit 88 is reduced by half compared to that in the 10th embodiment. As a result, the power consumption associated with the body (or substrate) bias voltage switching can be reduced by half, and faster switching is made possible.

EMBODIMENT 13

Figure 26:
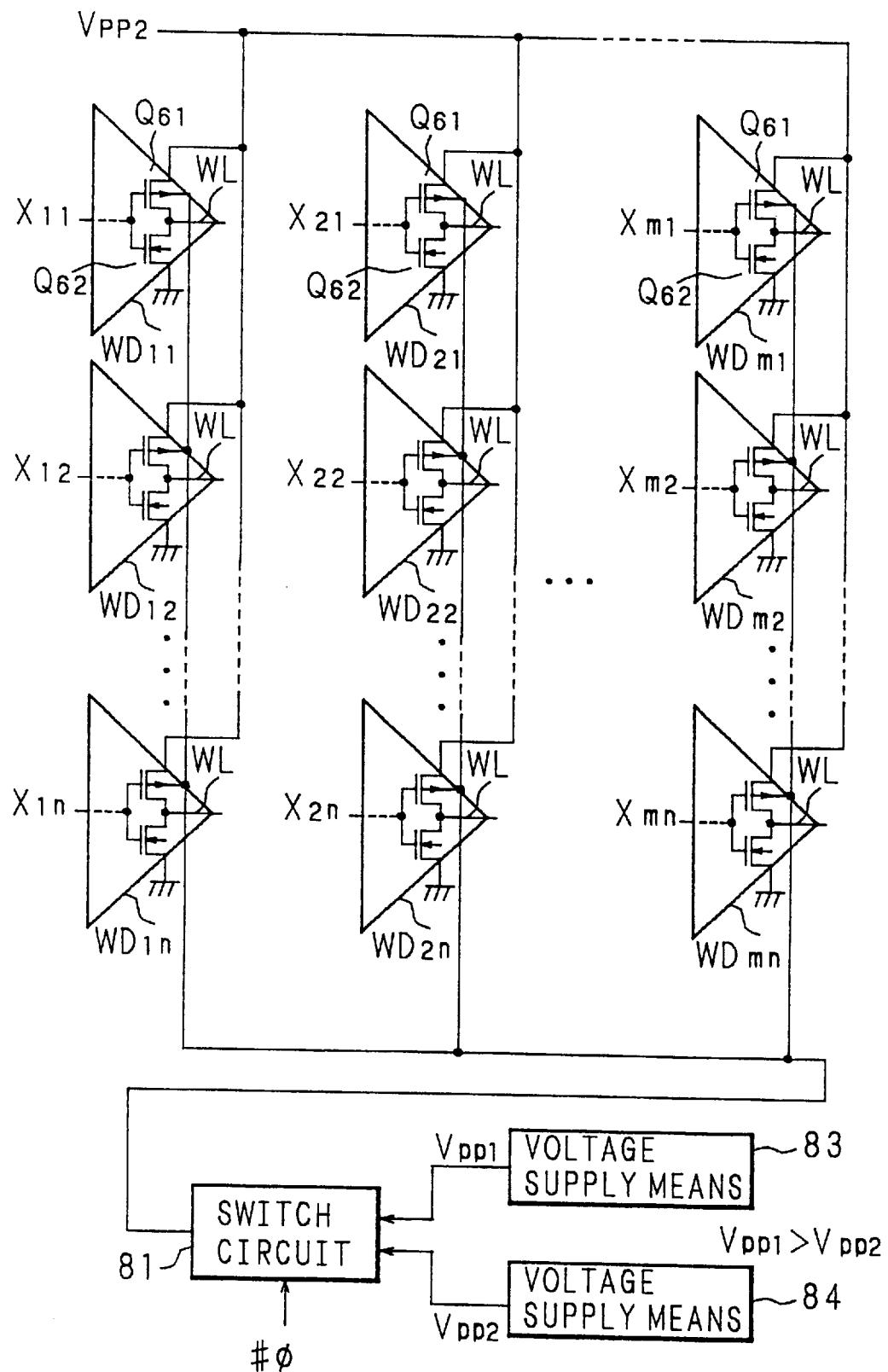
FIG. 26 is a block diagram showing a word driver according to a 13th embodiment of the present invention.

FIG. 26 is a block diagram showing a 13th embodiment of the semiconductor circuit according to the present invention. This embodiment is concerned with an example in which the present invention is applied to the word driver shown in FIG. 4. Each word driver WD consists of a pMOS-FET Q61 and an nMOS-FET Q62 connected in series between the ground and the power supply line $V_{PP2}$ (potential: $V_{PP2}$) connected to a voltage-raising power supply; a decoder signal X is inputted to the gates of the pMOS-FET Q61 and nMOS-FET Q62, and a word line WL is connected to the node between the drains of the pMOS-FET Q61 and nMOS-FET Q62. Word drivers WD of such configuration are arranged in a matrix array, n word drivers in each column and m word drivers in each row ($WD_{11}$ to $WD_{mn}$).

The body (or backgate) of the PMOS-FET Q61 in each word driver WD is connected to the same switch circuit 81 as that described in the foregoing embodiments.

In the thus configured semiconductor circuit, the substrate potential of the pMOS-FET Q61 is set to potential $V_{PP1}$ in the standby state by means of the switch circuit 81 In the active state, it is set to potential $V_{PP2}$ ($V_{PP1} > V_{PP2}$), and when the decoder signal $X_1$ is inputted to the selected word driver WD (for example, the word driver $WD_{11}$), the associated word line WL is activated.

This embodiment also realizes a DRAM that has a low standby current (subthreshold current) flowing in the standby state.

EMBODIMENT 14

Figure 27:
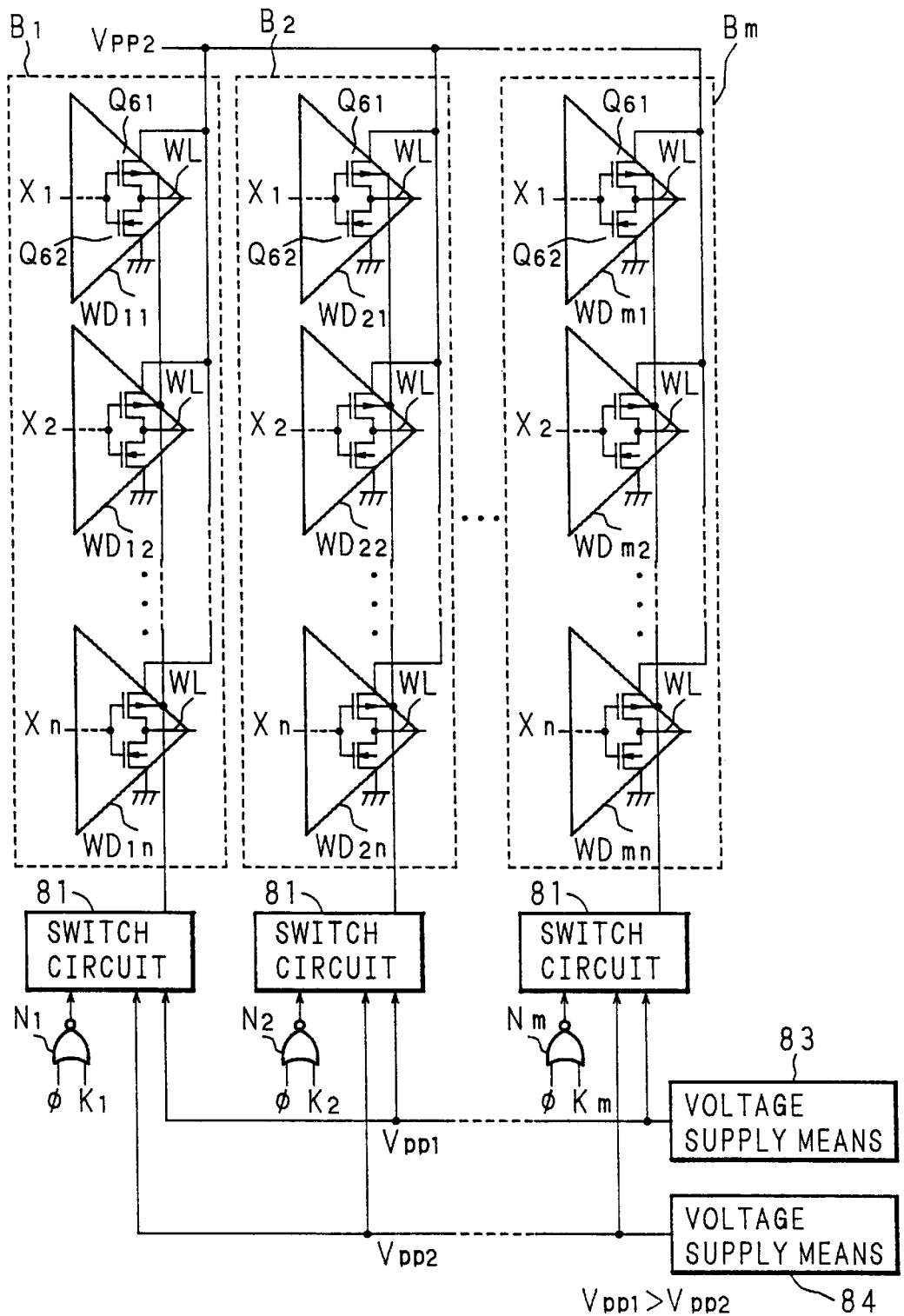
FIG. 27 is a block diagram showing a word driver according to a 14th embodiment of the present invention.

FIG. 27 is a block diagram showing a 14th embodiment of the semiconductor circuit according to the present invention. This embodiment is concerned with the implementation of a hierarchical-structured word driver configuration utilizing the present invention. The word drivers arranged vertically in FIG. 25 are organized in columns as word driver columns B1, B2, . . . , Bm. The body (or backgate) of the pMOS-FET Q61 is connected to one of switch circuits 81 which are provided one for each word driver column B. Potentials $V_{PP1}$, and $V_{PP2}$ are supplied to each switch circuit 81 from voltage supply means 83 and 84. Further, output signals from NOR circuits N1, N2, . . . , Nm, to each of which a clock signal ø of low level in the active state and a column select signal K for selecting the desired word driver column B are inputted, are supplied to the respective switch circuits 81. Otherwise, the configuration is same as that shown in FIG. 26; the same parts are designated by the same reference numerals, and further description thereof is omitted here.

In the above-configured semiconductor circuit, the clock signal ø and the column select signals, K1, K2, . . . , Km, are in high level in standby state, so that the body (or backgate) of the pMOS-FET Q61 the potential $V_{PP1}$ is supplied to. This raises the threshold voltage of the PMOS-FET Q61, and only negligible subthreshold current flows.

In the active state, the clock signal is in low level, and the column select signal K1 to be inputted to the switch circuit 81 connected to the selected word driver WD (for example, the word driver $WD_{11}$) is also in low level. The other column select signals K2, . . . , Km is in high level. When the decoder signal X1 is inputted to the pMOS-FET Q61, the associated word line WL is raised to the active state. Since, in the active state, the threshold voltage of the pMOS-FET Q61 in the selected word driver WD is lowered, the word line WL is raised quickly to the proper state.

In this embodiment, it is only necessary to increase the source potential only of the word driver column which contains the selected word driver WD, so that the rising time of the word line WL can be reduced as compared to the 12th embodiment.

Above mentioned embodiments can perform in both of the bulk structure FET and SOI structure FET.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor device comprising:
   a first power line;
   a primary second power line;
   a secondary second power line;
   a logic circuit receiving potentials from said first power line and said secondary second power line used for two logic levels of an output signal, the logic circuit including
   (i) a first nMOS-FET coupled to said secondary second power line and (ii) a second nMOS-FET coupled to a gate of said first nMOS-FET, said second nMOS-FET having a backgate connected to said primary second power line;
   a first FET coupled between said primary second power line and said secondary second power line, having a backgate receiving a potential at most the potential of said secondary second power line in a standby state, and rendered nonconductive in the standby state; and
   a bias switching circuit applying a bias potential to a backgate of the first nMOS-FET, the bias potential in an active state being higher than the bias potential in the standby state.

2. The semiconductor device according to claim 1, wherein said primary second power line supplies a ground potential.

3. The semiconductor device according to claim 1, wherein the backgate of said first FET is coupled to said primary second power line.

4. The semiconductor device according to claim 1, wherein:
   said first power line is a secondary first power line,
   said semiconductor device further comprises:
      a primary first power line; and
      a second FET coupled between said primary first power line and said secondary first power line, having a backgate receiving a potential at least the potential of said secondary first power line in the standby state, and rendered nonconductive in the standby state.

5. A semiconductor device comprising:
   a primary first power line;
   a secondary first power line;

a second power line;

a logic circuit receiving potentials from said secondary first power line and said second power line used for two logic levels of an output signal, the logic circuit including (i) a first pMOS-FET coupled to said secondary first power line and (ii) a second pMOS-FET coupled to a gate of said first pMOS-FET, said second pMOS-FET having a backgate connected to said primary first power line;

a first FET coupled between said primary first power line and said secondary first power line, having a backgate receiving a potential at least the potential of said secondary first power line in a standby state, and rendered nonconductive in the standby state; and a bias switching circuit applying a bias potential to a backgate of the first pMOS-FET, the bias potential in an active state being lower than the bias potential in the standby state.

6. A semiconductor device comprising:

a primary first power line; a secondary first power line;

a primary second power line;

a secondary second power line;

a logic circuit receiving potentials from said secondary first power line and said secondary second power line used for two logic levels of an output signal, wherein said logic circuit includes a first pMOS-FET and a first nMOS-FET serially coupled between said secondary first power line and said secondary second power line and a second pMOS-FET and a second nMOS-FET serially coupled between said secondary first power line and said secondary second power line, a backgate of the first pMOS-FET being coupled to said primary first power line, a backgate of the second nMOS-FET being coupled to said primary second power line;

a first FET coupled between said primary second power line and said secondary second power line, having a backgate receiving a potential at most the potential of said secondary second power line in a standby state, and rendered nonconductive in the standby state;

a second FET coupled between said primary first power line and said secondary first power line, having a backgate receiving a potential at least the potential of said secondary first power line in the standby state, and rendered nonconductive in the standby state; and a bias switching circuit applying a first bias potential to a backgate of the second pMOS-FET and a second bias potential to a backgate of the first nMOS-FET, the first bias potential in an active state being lower than the first bias potential in the standby state, the second bias potential in the active state being higher than the second bias potential in the standby state.

7. A semiconductor device comprising:

a first power line;

a primary second power line;

a secondary second power line;

a first FET coupled between said primary second power line and said secondary second power line, having a backgate receiving a potential at most the potential of said secondary second power line in a standby state, and turned off in the standby state;

a logic circuit including (i) a first nMOS-FET having a source coupled to said secondary second power line, (ii) a first pMOS-FET coupled between said first power line and a first node, the first pMOS-FET having a gate coupled to a drain of the first nMOS-FET, and (iii) a second nMOS-FET having a drain coupled to the first node, the second nMOS-FET having a gate coupled to the gate of the first pMOS-FET and having a backgate connected to said primary second power line; and a bias switching circuit applying a bias potential to a backgate of the first nMOS-FET, the bias potential in an active state being higher than the bias potential in the standby state.

8. A semiconductor device comprising:

a primary first power line;

a secondary first power line;

a second power line;

a first FET coupled between said primary first power line and said secondary first power line, having a backgate receiving a potential at least the potential of said secondary first power line in a standby state, and turned off in the standby state;

a logic circuit including (i) a first pMOS-FET having a source coupled to said secondary first power line, (ii) a first nMOS-FET coupled between said second power line and a first node, the first nMOS-FET having a gate coupled to a drain of the first pMOS-FET, and (iii) a second pMOS-FET having a drain coupled to the first node, the second pMOS-FET having a gate coupled to the gate of the first nMOS-FET and having a backgate connected to said primary first power line; and a bias switching circuit applying a bias potential to a backgate of the first pMOS-FET, the bias potential in an active state being lower than the bias potential in the standby state.

* * * * *